(12) United States Patent
Dietz et al.

(10) Patent No.: US 9,540,275 B2
(45) Date of Patent: Jan. 10, 2017

(54) CONDUCTIVE PASTE AND METHOD FOR PRODUCING A SEMICONDUCTOR DEVICE USING THE SAME

(71) Applicant: NAMICS CORPORATION, Niigata-shi, Niigata (JP)

(72) Inventors: Raymond Dietz, Amesbury, MA (US); Maciej Patelka, Salem, MA (US); Cathy Shaw Trumble, Barrington, NH (US); Noriyuki Sakai, Salem, MA (US); Hiroshi Yamaguchi, Niigata (JP)

(73) Assignee: NAMICS CORPORATION, Niigata-shi, Niigata (JP)

( * ) Notice: Subject to any disclaimer, the term of this patent is extended or adjusted under 35 U.S.C. 154(b) by 0 days.

(21) Appl. No.: 15/110,575

(22) PCT Filed: Jan. 15, 2015

(86) PCT No.: PCT/JP2015/051743
§ 371 (c)(1),
(2) Date: Jul. 8, 2016

(87) PCT Pub. No.: WO2015/108205
PCT Pub. Date: Jul. 23, 2015

(65) Prior Publication Data
US 2016/0326044 A1    Nov. 10, 2016

Related U.S. Application Data

(60) Provisional application No. 61/928,553, filed on Jan. 17, 2014.

(51) Int. Cl.
C03C 8/24       (2006.01)
H01L 23/00      (2006.01)
(Continued)

(52) U.S. Cl.
CPC ................. *C03C 8/24* (2013.01); *C03C 3/122* (2013.01); *C03C 3/125* (2013.01); *C03C 3/127* (2013.01);
(Continued)

(58) Field of Classification Search
CPC ............ C03C 8/24; C03C 3/122; C03C 3/125; C03C 3/127; C03C 4/14
See application file for complete search history.

(56) References Cited

U.S. PATENT DOCUMENTS 3,798,114 A    3/1974 Chvatal
4,636,257 A *  1/1987 Baudry ..................... C03C 8/24
                                                                    101/114
(Continued)

FOREIGN PATENT DOCUMENTS

JP    61138711 A    11/1976
JP    08502468 A     3/1996
(Continued)

OTHER PUBLICATIONS

International Search Report (ISR) and Written Opinion (WO) dated Apr. 21, 2015 issued in International Application No. PCT/JP2015/051743.

*Primary Examiner* — Errol Fernandes
(74) *Attorney, Agent, or Firm* — Holtz, Holtz & Volek PC

(57) ABSTRACT

A conductive paste including (A) conductive particles, (B) a glass frit containing substantially no lead, arsenic, tellurium, and antimony, and (C) a solvent. The glass frit (B) has a remelting temperature of 320 to 360° C., wherein the remelting temperature is indicated by a peak top of at least one endothermic peak having an endotherm of 20 J/g or more in a DSC curve as measured by a differential scanning calorimeter. The conductive paste can also include at least one metal oxide (D) selected from the group consisting of tin oxide, zinc oxide, indium oxide, and copper oxide. The glass
(Continued)

frit (B) can further include (B-1) $Ag_2O$, (B-2) $V_2O_5$, and (B-3) $MoO_3$. The conductive paste can achieve binding at a relatively low temperature (such as 370° C. or lower) and maintains a bond strength at a relatively high temperature (such as 300 to 360° C.).

15 Claims, 4 Drawing Sheets

(51) Int. Cl.
    *C09J 9/02*     (2006.01)
    *C03C 4/14*     (2006.01)
    *C03C 3/12*     (2006.01)
    *H01B 1/16*     (2006.01)

(52) U.S. Cl.
    CPC .. *C03C 4/14* (2013.01); *C09J 9/02* (2013.01); *H01B 1/16* (2013.01); *H01L 24/83* (2013.01); *C03C 2204/00* (2013.01); *C03C 2205/00* (2013.01); *H01L 2224/83851* (2013.01); *H01L 2224/83948* (2013.01); *H01L 2924/10272* (2013.01)

(56) References Cited

U.S. PATENT DOCUMENTS

| | | |
|---|---|---|
| 4,933,030 A | 6/1990 | Dietz |
| 5,334,558 A | 8/1994 | Dietz et al. |
| 5,543,366 A | 8/1996 | Dietz et al. |
| 6,174,462 B1* | 1/2001 | Oka ............................ C03C 8/02 252/508 |
| 2008/0211384 A1* | 9/2008 | Sawai ....................... C03C 3/21 313/495 |
| 2011/0192456 A1* | 8/2011 | Hang ........................ C03C 8/02 136/256 |
| 2015/0249167 A1 | 9/2015 | Zhang et al. |
| 2015/0279700 A1* | 10/2015 | Kodama ................... C03C 8/02 428/212 |

FOREIGN PATENT DOCUMENTS

| | | |
|---|---|---|
| JP | 08259262 A | 10/1996 |
| JP | 2007073531 A | 3/2007 |
| JP | 2012109148 A | 6/2012 |
| JP | 2012243865 A | 12/2012 |
| JP | 2013182714 A | 9/2013 |
| WO | 2012153553 A1 | 11/2012 |
| WO | 2014059577 A1 | 4/2014 |

* cited by examiner

Fig. 3

Table 1. Ag powders used in SiC Die Attach Evaluation

| | SA-1507<br>Metalor Tech. USA<br>D50 = 18 microns<br>range approx. 8-36 microns | EA-0298<br>Metalor Tech. USA<br>D50 = 3.5 microns<br>range approx. 1-25 microns | P318-8<br>Metalor Tech. USA<br>D50 = 5 microns<br>range approx. 2-18 microns | K-0082P<br>Metalor Tech. USA<br>D50 = 1.2 microns<br>range approx. 0.7-4 microns | SF50S<br>Ferro<br>ave surface area = 3.8m2/g |
|---|---|---|---|---|---|
| SEM 1000x | | | | | |
| SEM 2000x | | | | | |
| SEM 5000x | | | | | |

CONDUCTIVE PASTE AND METHOD FOR PRODUCING A SEMICONDUCTOR DEVICE USING THE SAME

CROSS-REFERENCE TO RELATED APPLICATIONS

The present application is a U.S. National Phase patent application of International Application No. PCT/JP2015/051743, filed Jan. 15, 2015, which claims the priority under 35 USC 119(e) of U.S. Provisional Patent Application No. 61/928,553, filed Jan. 17, 2014. Both of the above-identified applications are incorporated herein by reference.

FIELD OF THE INVENTION

The present invention relates to a conductive paste comprising low melting-point glass which does not contain an injurious material, such as lead, and a method for producing a semiconductor device using the conductive paste.

BACKGROUND ART

A die attach material for bonding, for example, a silicon carbide (SiC) chip to a substrate, and a sealing material and a conductive paste for electronic parts, such as a ceramic package containing therein an integrated circuit device, and a display device, are desired to achieve bonding at relatively low temperatures, taking into consideration the properties of objects to be bonded or to be sealed which are extremely sensitive to heat. As a conductive paste which can achieve bonding at low temperatures, a composition comprising glass having a low melting point is used.

Conventionally, as low melting-point glass, $PbO-B_2O_3$ glass having a low melting point has been known. Patent document 1 discloses, as glass having a low softening point, glass comprising 20 to 70% of silver oxide, 10 to 70% of an oxide of vanadium or molybdenum, and 10 to 70% of an oxide of a semi-metal selected from the group consisting of phosphorus, germanium, arsenic, antimony, bismuth, and tellurium (patent document 1).

With respect to glass which can be calcined at a temperature lower than the calcination temperature for the conventional low melting-point $PbO-B_2O_3$ glass, patent document 2 discloses low melting-point glass comprising $Ag_2O$: 8 to 20%, $MoO_3$: 20 to 35%, $ZnO$: 1 to 6%, $TeO_2$: 30 to 55%, and $V_2O_5$: 5 to 19% (patent document 2).

With respect to glass used in, for example, a die attach material, there is disclosed glass comprising, for example, $Ag_2O$ in an amount of about 40 to 65% by mass, $V_2O_5$ in an amount of about 15 to 35% by mass, and at least one oxide selected from the group consisting of $TeO_2$, $PbO_2$, and $Pb_3O_4$ in an amount of about 0 to 50% by mass, in terms of the oxide, wherein the glass forms a $Ag_2O-V_2O_5-TeO_2-PbO_2$ crystal (for example, patent document 3). The glass disclosed in patent document 3 is used in, for example, a ceramic package containing therein a temperature-sensitive integrated circuit device as a paste for bonding the temperature sensitive device at a low temperature (for example, at 350° C.).

The cited document 4 discloses a glass composition which comprises $Tl_2O_3$ in an amount of 60 to 82.5% by weight, $V_2O_5$ in an amount of about 2.5 to 27.5% by weight, and $P_2O_5$ in an amount of about 2.5 to 17.5% by weight, in terms of the oxide, and which has a boundary temperature of about 350° C. or lower at which vitrification occurs (patent document 4). Patent document 4 discloses that the glass composition has a boundary temperature of 460° C. or lower at which no devitrification occurs. The devitrification means that molten glass suffers crystal deposition of part of the glass having a certain composition during, for example, solidification of the molten glass upon cooling.

Patent document 5 discloses a paste comprising conductive metal particles, a glass composition, an organic solvent, and a resin. Patent document 5 has a description showing that the glass composition specifically preferably has a remelting temperature of 275° C. or lower. Patent document 5 has a description showing that when the glass composition contained in the paste has a high remelting temperature, the amount of the glass phase which satisfactorily wets the surface of an adherend is reduced, so that the bond strength of the paste becomes poor. The cited document 5 discloses that the combination of $TeO_2$ and $PbO_2$ in the respective optimal amounts provides glass having crystalline properties and low-temperature properties desirable in respect of the structure finally obtained.

PRIOR ART REFERENCES

Patent Documents

Patent document 1: Japanese Unexamined Patent Publication No. Sho 51-138711
Patent document 2: Japanese Unexamined Patent Publication No. Hei 8-259262
Patent document 3: Japanese Patent Application prior-to-examination Publication (kohyo) No. Hei 8-502468
Patent document 4: U.S. Pat. No. 4,933,030 specification
Patent document 5: U.S. Pat. No. 5,543,366 specification

SUMMARY OF THE INVENTION

Problems to be Solved by the Invention

However, it is likely that the low melting-point $PbO-B_2O_3$ glass and low melting-point glass disclosed in patent documents 1 to 3 and 5 contain an injurious material, such as lead (Pb), arsenic (As), antimony (Sb), or tellurium (Te). Also in patent document 4, thallium (Tl) can become an injurious material. In recent years, concern about the environment and the like is growing, and therefore a conductive paste using low melting-point glass containing no injurious material is desired. Further, the conductive paste is desired to use low melting-point glass that can be applied to a semiconductor device and an integrated circuit device which are extremely sensitive to heat.

Further, in recent years, a SiC semiconductor device which causes only a small loss in the electric power conversion and which can be stably operated even at high temperatures is attracting attention. The SiC semiconductor device has a high junction temperature, as compared to a silicon (Si) semiconductor device. In such a SiC semiconductor device, with respect to the conductive paste used in a die attach material for bonding together the semiconductor chip and a substrate, one which can achieve bonding at a relatively low temperature (for example, at 370° C. or lower) as a heating temperature is desired. On the other hand, there is desired the conductive paste which can maintain the bond strength between the SiC semiconductor chip and the substrate bonded by the paste even in the operation environment for device at a relatively high temperature (for example, at 300 to 350° C.). The glass composition contained in the paste disclosed in patent document 5 specifically has a remelting temperature of 275° C. or lower. With respect to the semiconductor device obtained by bonding a semiconductor chip to a substrate using the paste disclosed in patent document 5, it is presumed that when the semiconductor device is placed in an environment at a relatively high temperature (for example, at 300 to 350° C.), the bond strength between the semiconductor chip and the substrate becomes poor.

Accordingly, a task of the present invention is to provide a conductive paste comprising low melting-point glass which does not contain an injurious material, such as lead, arsenic, tellurium, or antimony, wherein the conductive paste is advantageous not only in that the paste can achieve bonding at a relatively low temperature (for example, at 370° C. or lower) as a heating temperature, but also in that the paste can maintain the bond strength even in an environment at a relatively high temperature (for example, at 300 to 350° C.).

Means to Solve the Problems

The present invention 1 is directed to a conductive paste which comprises (A) conductive particles, (B) a glass frit containing substantially no lead, arsenic, tellurium, and antimony, and (C) a solvent, the glass frit (B) having a remelting temperature of 320 to 360° C., wherein the remelting temperature is indicated by the peak top of at least one endothermic peak having an endotherm of 20 J/g or more in a DSC curve as measured by a differential scanning calorimeter.

The present invention 2 is directed to the conductive paste of the present invention 1, which further comprises (D) at least one metal oxide selected from the group consisting of tin oxide, zinc oxide, indium oxide, and copper oxide.

The present invention 3 is directed to the conductive paste of the present invention 1, wherein the conductive particles (A) are contained in an amount of 60 to 90% by mass, the glass frit (B) is contained in an amount of 5 to 35% by mass, and the solvent (C) is contained in an amount of 5 to 12% by mass, based on the mass of the conductive paste.

The present invention 4 is directed to the conductive paste of the present invention 2, wherein the conductive particles (A) are contained in an amount of 60 to 85% by mass, the glass frit (B) is contained in an amount of 5 to 35% by mass, the solvent (C) is contained in an amount of 5 to 10% by mass, and the metal oxide (D) is contained in an amount of 0 to 5% by mass, based on the mass of the conductive paste.

The present invention 5 is directed to the conductive paste of any one of the present inventions 1 to 4, wherein the glass frit (B) comprises (B-1) $Ag_2O$, (B-2) $V_2O_5$, and (B-3) $MoO_3$.

The present invention 6 is directed to the conductive paste according to the present invention 5, wherein the glass frit (B) further comprises (B-4) at least one oxide selected from the group consisting of ZnO, CuO, $TiO_2$, MgO, $Nb_2O_5$, BaO, $Al_2O_3$, SnO, and $Fe_2O_3$.

The present invention 7 is directed to the conductive paste of the present invention 5 or 6, wherein the glass frit (B) contains $Ag_2O$ (B-1) and $V_2O_5$ (B-2) in a total amount of 80 to 96% by mass in terms of the oxide, based on the mass of the glass frit (B), wherein the mass ratio of $Ag_2O$ (B-1) to $V_2O_5$ (B-2) ($Ag_2O/V_2O_5$) is 1.8 to 3.2.

The present invention 8 is directed to the conductive paste of any one of the present inventions 5 to 7, wherein the glass frit (B) contains $MoO_3$ (B-3) in an amount of 4 to 10% by mass in terms of the oxide, based on the mass of the glass frit (B).

The present invention 9 is directed to the conductive paste of any one of the present inventions 6 to 8, wherein the glass frit (B) contains $MoO_3$ (B-3) and component (B-4) in a total amount of 4 to 20% by mass in terms of the oxide, based on the mass of the glass frit (B).

The present invention 10 is directed to the conductive paste according to any one of the present inventions 5 to 9, wherein the glass frit (B) contains $Ag_2O$ (B-1) in an amount of 40 to 80% by mass, $V_2O_5$ (B-2) in an amount of 16 to 40% by mass, and $MoO_3$ (B-3) in an amount of 4 to 10% by mass, each in terms of the oxide, based on the mass of the glass frit (B).

The present invention 11 is directed to the conductive paste of any one of the present inventions 6 to 10, wherein the glass frit (B) contains component (B-4) in an amount of 0 to 12% by mass in terms of the oxide, based on the mass of the glass frit (B).

The present invention 12 is directed to the conductive paste of any one of the present inventions 1 to 11, wherein the conductive particles (A) are silver.

The present invention 13 is directed to the conductive paste of any one of the present inventions 1 to 12, wherein the mass ratio of the conductive particles (A) and the glass frit (B) (conductive particles:glass frit) is 50:50 to 98:2.

The present invention 14 is directed to a method for producing a semiconductor device, wherein the method comprises the steps of:

applying the conductive paste of any one of the present inventions 1 to 13 to a substrate and/or a semiconductor chip;

placing the semiconductor chip on the substrate through the conductive paste;

heating the conductive paste to the remelting temperature of the glass frit (B) contained in the conductive paste or higher to sinter the conductive particles (A) contained in the conductive paste so that the semiconductor chip and the substrate are electrically connected to each other; and gradually cooling the conductive paste.

The present invention 15 is directed to a method for producing a semiconductor device, wherein the method comprises the steps of:

applying the conductive paste of any one of the present inventions 1 to 13 to a substrate and/or a semiconductor chip;

placing the semiconductor chip on the substrate through the conductive paste;

heating the conductive paste to reduce $Ag_2O$ (B-1) in the glass frit (B) contained in the conductive paste;

further heating the conductive paste to the remelting temperature of the glass frit (B) contained in the conductive paste or higher; and gradually cooling the conductive paste to cause crystals to be precipitated.

Effect of the Invention

The conductive paste of the present invention is advantageous in that a SiC chip and a substrate can be bonded to each other using the conductive paste by heating at a relatively low temperature (for example, at 370° C. or lower) as a heating temperature to obtain a semiconductor device. In addition, the conductive paste of the present invention is advantageous in that a semiconductor chip and a substrate can be bonded to each other using the conductive paste, and, after bonding, the bond strength between the semiconductor chip and the substrate can be maintained even in an environment at a relatively high temperature (for example, at 300 to 350° C.), and thus the obtained semiconductor device has an improved heat resistance.

Further, in the present invention, there is provided a method for producing a semiconductor device, which is advantageous in that the conductive particles contained in the conductive paste are sintered to electrically connect a semiconductor chip to a substrate, so that a semiconductor device having high electrical conductive properties can be obtained.

In the present invention, by heating the conductive paste to the remelting temperature of the glass frit contained in the conductive paste or higher and then gradually cooling the paste, it is possible to cause deposition of silver and crystals in the calcined film bonding the semiconductor chip to the substrate. The calcined film bonding the semiconductor chip to the substrate tends to have a melting temperature higher than that of the glass frit contained in the conductive paste as a raw material. In the present invention, there is provided a method for producing a semiconductor device, which is advantageous in that the obtained semiconductor device having a semiconductor chip and a substrate bonded using the conductive paste can maintain the bond strength between the substrate and the semiconductor chip even when placed in an environment at a relatively high temperature (for example, at 300 to 350° C.).

BRIEF DESCRIPTION OF THE DRAWINGS

FIG. 3 shows scanning electron microscope (SEM) photomicrographs of the silver particles used in the respective conductive pastes, taken at magnifications of 1,000 times, 2,000 times, and 5,000 times.

MODE FOR CARRYING OUT THE INVENTION

Figure 1:
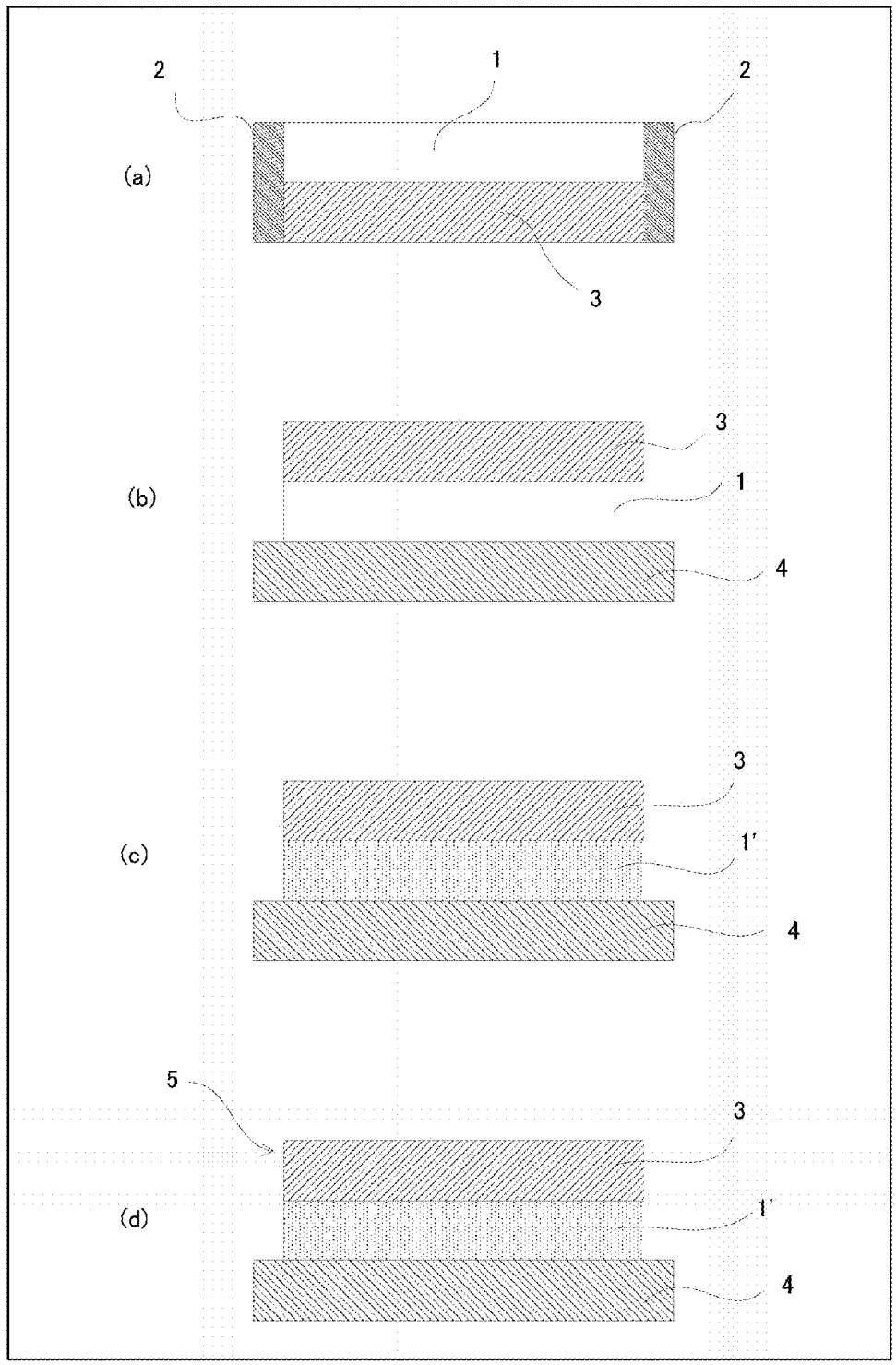
FIG. 1 is a diagram showing the steps in an embodiment of the method for producing a semiconductor device.

The present invention is directed to a conductive paste which comprises (A) conductive particles, (B) a glass frit containing substantially no lead (Pb), arsenic (As), antimony (Sb), and tellurium (Te), and (C) a solvent, wherein the glass frit (B) has a remelting temperature of 320 to 360° C., wherein the remelting temperature is indicated by the peak top of at least one endothermic peak having an endotherm of 20 J/g or more in a DSC curve as measured by a differential scanning calorimeter.

[(A) Conductive Particles]

With respect to the conductive particles used in the conductive paste of the present invention, for example, silver (Ag), copper (Cu), nickel (Ni), or a silver alloy of silver and a base metal (for example, Cu or Ni) can be used. Especially the conductive particles are preferably silver (Ag).

With respect to the shape and average particle diameter of the conductive particles, there is no particular limitation, and those known in the corresponding field can be used. The conductive particles preferably have an average particle diameter of 0.01 to 40 μm, more preferably 0.05 to 30 μm, further preferably 0.1 to 20 μm. When the average particle diameter of the conductive particles is in the range of from 0.01 to 40 μm, the dispersibility of the conductive particles in the paste is excellent, so that excellent sintering properties are achieved during sintering. The average particle diameter of the conductive particles indicates a D50 (median diameter) in the volume cumulative distribution as measured using a laser diffraction-scattering type measurement apparatus for particle diameter and particle size distribution (for example, MICROTRAC HRA9320-X100, manufactured by Nikkiso Co., Ltd.). With respect to the shape of the conductive particles, the conductive particles may have a spherical shape, a shape of flakes or scales, or a polyhedral shape.

When silver particles are used as the conductive particles, silver particles having a size at a nano-level or silver particles having pores filled with a resin may be used.

[(B) Glass Frit]

The glass frit used in the conductive paste of the present invention contains substantially no lead, arsenic, antimony, and tellurium. The glass frit used in the conductive paste of the present invention is characterized by having a remelting temperature (Tr) of 320 to 360° C., wherein the remelting temperature is indicated by the peak top of at least one endothermic peak having an endotherm of 20 J/g or more in a DSC curve in the temperature region of from 320 to 360° C. as measured by a differential scanning calorimeter.

The remelting temperature (Tr) can be determined from an endothermic peak appearing in a DSC curve in the range of from 50 to 370° C. as measured using a differential scanning calorimeter (for example, SHIMADZU DSC-50), wherein the DSC curve is prepared by elevating the temperature of the glass frit to 370° C. under conditions, for example, at a temperature elevation rate of 15° C./min in an atmosphere under atmospheric pressure. The temperature at the first point of inflection in the DSC curve of the glass frit indicates a glass transition temperature (Tg). Further, in the DSC curve of the glass frit, an exothermic peak attributed to crystallization of the glass frit and an endothermic peak attributed to fusion of the glass frit appear. In the DSC curve of the glass frit, the exothermic peak appears with a positive (+) value. In the DSC curve of the glass frit, the endothermic peak appears with a negative (−) value. In the DSC curve of the glass frit, a plurality of exothermic peaks may appear. Further, in the DSC curve of the glass frit, a plurality of endothermic peaks may appear.

With respect to the glass frit used in the conductive paste of the present invention, when the DSC curve has a plurality of endothermic peaks, the glass frit having a remelting temperature (Tr) in the temperature region of from 320 to 360° C. is used, wherein the remelting temperature (Tr) is indicated by the peak top of at least one endothermic peak having an endotherm of 20 J/g or more among the endothermic peaks. When a plurality of endothermic peaks appear in the DSC curve of the glass frit, the peak top of at least one endothermic peak having an endotherm of 20 J/g or more of the glass frit is present in the temperature region of from 320 to 360° C. In the glass frit, as long as the peak top of at least one endothermic peak having an endotherm of 20 J/g or more in a DSC curve is present in the temperature region of from 320 to 360° C., the peak tops of any other endothermic peaks having an endotherm of 20 J/g or more may be present in the temperature region of higher than 360° C.

The glass frit used in the conductive paste of the present invention has a remelting temperature (Tr) in the temperature region of from 320 to 360° C., wherein the remelting temperature (Tr) is indicated by the peak top of at least one endothermic peak having an endotherm of 20 J/g or more in a DSC curve as measured by a differential scanning calorimeter. The glass transition temperature (Tg) and crystallization temperature (Tc) shown in the DSC curve of the glass frit are lower than the remelting temperature (Tr). By heating the conductive paste comprising the glass frit at a temperature of the remelting temperature of the glass frit or higher (for example, at 370° C. or lower; for example, when the remelting temperature of the glass frit is 360° C., at a temperature of higher than 360 to 370° C.), the glass frit contained in the conductive paste is molten, making it possible to bond together adherends. The conductive paste of the present invention can bond together adherends at a relatively low temperature (for example, at 370° C. or lower; for example, when the remelting temperature of the glass frit is 360° C., at a temperature of higher than 360 to 370° C.), and therefore can be advantageously used in, for example, a semiconductor device and an integrated circuit device which are sensitive to heat. Further, the remelting temperature (Tr) of the glass frit in the conductive paste is 320° C. or higher, and therefore a semiconductor device having a semiconductor chip and a substrate bonded together using the conductive paste can maintain the bond strength even when operated in an environment at a relatively high temperature (for example, at 300 to 350° C.).

The glass frit used in the conductive paste of the present invention has a remelting temperature (Tr) in the temperature region of from 320 to 360° C., wherein the remelting temperature (Tr) is indicated by the peak top of at least one endothermic peak having an endotherm of 20 J/g or more in a DSC curve as measured by a differential scanning calorimeter. Therefore, when the glass frit is heated to the remelting temperature (Tr) or higher and then cooled, crystals are further formed in the calcined film formed from the conductive paste. With respect to the glass frit which has been heated to the remelting temperature (Tr) or higher and molten and subsequently cooled, the temperature read at the peak top of at least one endothermic peak having an endotherm of 20 J/g or more as measured by a differential scanning calorimeter tends to be higher than the remelting temperature of 320 to 360° C. The reason for such a tendency is not clear, but is presumed as follows. The conductive paste is heated to a temperature which is higher than the crystallization temperature (Tc) of the glass frit and which is the remelting temperature (Tr) of the glass frit or higher, and then cooled. With respect to the glass frit contained in the conductive paste, the crystallized glass which has undergone crystallization is remelted, and then is cooled to undergo further crystallization. There is a difference in the way of crystal deposition between the crystallized glass caused by crystallization of part of the glass frit and the crystallized glass caused by the first crystallization. One of the reasons why the temperature read at the peak top of at least one endothermic peak having an endotherm of 20 J/g or more as measured by a differential scanning calorimeter tends to be higher than the remelting temperature of 320 to 360° C. is presumed to reside in the difference in the way of crystal deposition between the crystallized glass caused by crystallization of the molten glass frit and the crystallized glass caused by the first crystallization. By virtue of such crystals deposited in the calcined film formed by heating the conductive paste and cooling it, the bond strength between the semiconductor chip and the substrate bonded using the conductive paste can be maintained even when the semiconductor device is operated in an environment at a relatively high temperature (for example, at 300 to 350° C.).

The remelting temperature (Tr) of the glass frit used in the conductive paste of the present invention is a temperature indicated by the peak top of at least one endothermic peak having an endotherm of 20 J/g or more in a DSC curve as measured by a differential scanning calorimeter, and the endotherm of 20 J/g or more confirms the state in which the crystals in the glass frit are completely molten. When there is an endothermic peak having an endotherm of less than 20 J/g in a DSC curve as measured by a differential scanning calorimeter, it is considered that crystals remain in the glass frit. When the conductive paste is heated at a temperature as relatively low as the remelting temperature of the glass frit or higher (for example, at 370° C. or lower; for example, when the remelting temperature of the glass frit is 360° C., at a temperature of higher than 360 to 370° C.), there is a possibility that the crystals in the glass frit contained in the conductive paste are not completely molten. When the crystals of the glass frit contained in the conductive paste remain as such in the calcined film obtained by calcining the conductive paste, the conductive properties of the calcined film with the semiconductor chip and substrate may become poor. Further, when the crystals of the glass frit contained in the conductive paste remain as such in the calcined film by calcining the conductive paste, the bond strength between the semiconductor chip and the substrate may become poor. Furthermore, there is a possibility that the semiconductor device obtained by bonding a semiconductor chip to a substrate using the conductive paste cannot maintain the bond strength in an environment at a relatively high temperature (for example, at 300 to 350° C.).

The glass frit preferably has a glass transition temperature (Tg) of 180° C. or lower, more preferably 170° C. or lower, further preferably 168° C. or lower, especially preferably 165° C. or lower.

The glass frit preferably has a crystallization temperature (Tc) of 280° C. or lower, more preferably 270° C. or lower, further preferably 260° C. or lower, wherein the crystallization temperature (Tc) is indicated by the peak top of at least one exothermic peak having an exotherm of 20 J/g or more in a DSC curve as measured by a differential scanning calorimeter. The glass frit preferably has a crystallization temperature (Tc) of 160° C. or higher, more preferably 165° C. or higher, further preferably 170° C. or higher, wherein the crystallization temperature (Tc) is indicated by the peak top of at least one exothermic peak having an exotherm of 20 J/g or more in a DSC curve as measured by a differential scanning calorimeter. The glass frit preferably has a crystallization temperature (Tc) in the temperature region of from 160 to 280° C., wherein the crystallization temperature (Tc) is indicated by the peak top of at least one exothermic peak having an endotherm of 20 J/g or more in a DSC curve as measured by a differential scanning calorimeter. The glass frit more preferably has a crystallization temperature (Tc) in the temperature region of from 170 to 270° C., wherein the crystallization temperature (Tc) is indicated by the peak top of at least one exothermic peak having an endotherm of 20 J/g or more in a DSC curve as measured by a differential scanning calorimeter. When a plurality of exothermic peaks appear in the DSC curve of the glass frit, the peak top of at least one exothermic peak having an exotherm of 20 J/g or more of the glass frit is present in the temperature region of from 160 to 280° C. In the glass frit, as long as the peak top of at least one exothermic peak having an exotherm of 20 J/g or more in the DSC curve is present in the temperature region of from 160 to 280° C., the peak tops of any other exothermic peaks having an exotherm of 20 J/g or more may be present in the temperature region of higher than 280° C.

With respect to the size of the glass frit, there is no particular limitation. The glass frit preferably has a volume-based average particle diameter (median diameter) of 1 to 200 μm, more preferably 3 to 180 μm, further preferably 3 to 160 μm, especially preferably 5 to 150 μm. The glass frit can be obtained by placing raw materials for the glass frit in a porcelain crucible, and placing the crucible in a melt furnace (oven) to heat and melt the materials, obtaining molten glass, and feeding the molten glass between rollers made of stainless steel to shape the glass into a sheet form, and grinding the obtained sheet-form glass using a mortar, and subjecting the ground glass to sieve classification using, for example, 100-mesh and 200-mesh test sieves. With respect to the mesh size of the test sieve, there is no particular limitation, and the glass frit having a smaller average particle diameter (median diameter) can be obtained by sieve classification using a fine-mesh test sieve. The average particle diameter of the glass frit can be measured using a laser diffraction-scattering type measurement apparatus for particle diameter and particle size distribution (for example, MICROTRAC HRA9320-X100, manufactured by Nikkiso Co., Ltd.). The average particle diameter of the glass frit indicates a D50 (median diameter) in the volume cumulative distribution.

It is preferred that the glass frit comprises (B-1) $Ag_2O$, (B-2) $V_2O_5$, and (B-3) $MoO_3$. The glass frit contains substantially no lead (Pb), arsenic (As), tellurium (Te), and antimony (Sb). Further, the glass frit contains substantially no thallium (Tl). When the glass frit does not contain an injurious material, such as lead (Pb), arsenic (As), tellurium (Te), or antimony (Sb), a conductive paste having high safety such that the paste does not adversely affect the environment can be obtained.

It is preferred that the glass frit contains $Ag_2O$ (B-1) and $V_2O_5$ (B-2) in a total amount of 80 to 96% by mass in terms of the oxide, based on the mass of glass frit (B), wherein the mass ratio of $Ag_2O$ (B-1) to $V_2O_5$ (B-2) ($Ag_2O/V_2O_5$) is 1.8 to 3.2. In the present specification, the amounts of the respective components contained in the glass frit are individually expressed in % by mass in terms of the oxide, based on the mass of the glass frit, unless otherwise specified.

It is more preferred that the glass frit contains $Ag_2O$ (B-1) and $V_2O_5$ (B-2) in a total amount of 82 to 95% by mass, based on the mass of glass frit (B). Further, in the glass frit, the mass ratio of $Ag_2O$ (B-1) to $V_2O_5$ (B-2) ($Ag_2O/V_2O_5$) is preferably 1.8 to 3.2, more preferably 1.95 to 2.7, further preferably 1.95 to 2.6. When the total amount of components (B-1) and (B-2) contained in the glass frit is 82 to 95% by mass, the glass frit having a relatively low remelting temperature (Tr) can be obtained.

It is preferred that the glass frit contains $MoO_3$ (B-3) in an amount of 4 to 10% by mass, based on the mass of the glass frit. When the amount of component (B-3) contained in the glass frit is 4 to 10% by mass, the glass frit having a remelting temperature (Tr) in the temperature region of from 320 to 360° C. can be obtained.

It is preferred that the glass frit further comprises (B-4) at least one oxide selected from the group consisting of ZnO, CuO, $TiO_2$, MgO, $Nb_2O_5$, BaO, $Al_2O_3$, SnO, and $Fe_2O_3$. The oxides as component (B-4) may be used individually or in combination.

It is preferred that the glass frit contains $MoO_3$ (B-3) and component (B-4) in a total amount of 4 to 20% by mass, based on the mass of the glass frit. When the total amount of components (B-3) and (B-4) contained in the glass frit is 4 to 20% by mass, the glass frit having a remelting temperature (Tr) in the temperature region of from 320 to 360° C. can be obtained.

The glass frit preferably contains component (B-4) in an amount of 0 to 12% by mass, more preferably 0.5 to 10% by mass, further preferably 1 to 8% by mass, especially preferably 2 to 8% by mass, in terms of the oxide, based on the mass of the glass frit. When the amount of component (B-4) contained is in the range of from 0 to 12% by mass, the glass frit having a remelting temperature (Tr) in the temperature region of from 320 to 360° C. can be obtained.

When the glass frit substantially comprises $Ag_2O$ (B-1), $V_2O_5$ (B-2), and $MoO_3$ (B-3), it is preferred that $Ag_2O$ (B-1), $V_2O_5$ (B-2), and $MoO_3$ (B-3) have their respective compositions shown below, based on the mass of the glass frit.

The amount of $Ag_2O$ (B-1) is preferably 40 to 80% by mass, more preferably 45 to 75% by mass, further preferably 50 to 70% by mass; the amount of $V_2O_5$ (B-2) is preferably 16 to 40% by mass, more preferably 17 to 35% by mass, further preferably 18 to 30% by mass; and the amount of $MoO_3$ (B-3) is preferably 4 to 10% by mass, more preferably 5 to 9% by mass, more preferably 6 to 8% by mass.

When the glass frit substantially comprises $Ag_2O$ (B-1), $V_2O_5$ (B-2), $MoO_3$ (B-3), and ZnO (B-4), it is preferred that $Ag_2O$ (B-1), $V_2O_5$ (B-2), $MoO_3$ (B-3), and ZnO (B-4) have their respective compositions shown below, based on the mass of the glass frit.

The amount of $Ag_2O$ (B-1) is preferably 40 to 70% by mass, more preferably 45 to 70% by mass, further preferably 50 to 65% by mass; the amount of $V_2O_5$ (B-2) is preferably 10 to 40% by mass, more preferably 12 to 35% by mass, further preferably 15 to 30% by mass; the amount of $MoO_3$ (B-3) is preferably 4 to 10% by mass; and the amount of ZnO (B-4) is preferably 0.5 to 12% by mass, more preferably 1 to 12% by mass, and the mass ratio of $Ag_2O$ (B-1) to $V_2O_5$ (B-2) ($Ag_2O/V_2O_5$) is preferably 1.95 to 2.6.

When the glass frit substantially comprises $Ag_2O$ (B-1), $V_2O_5$ (B-2), $MoO_3$ (B-3), and CuO (B-4), it is preferred that $Ag_2O$ (B-1), $V_2O_5$ (B-2), $MoO_3$ (B-3), and CuO (B-4) have their respective compositions shown below, based on the mass of the glass frit.

The amount of $Ag_2O$ (B-1) is preferably 40 to 70% by mass, more preferably 45 to 70% by mass, further preferably 50 to 65% by mass; the amount of $V_2O_5$ (B-2) is preferably 10 to 40% by mass, more preferably 12 to 35% by mass, further preferably 15 to 30% by mass; the amount of $MoO_3$ (B-3) is preferably 4 to 10% by mass; and the amount of CuO (B-4) is preferably 1 to 12% by mass, more preferably 1 to 10% by mass, further preferably 1 to 8% by mass, especially preferably 1 to 4% by mass.

When the glass frit substantially comprises $Ag_2O$ (B-1), $V_2O_5$ (B-2), $MoO_3$ (B-3), and $TiO_2$ (B-4), it is preferred that $Ag_2O$ (B-1), $V_2O_5$ (B-2), $MoO_3$ (B-3), and $TiO_2$ (B-4) have their respective compositions shown below, based on the mass of the glass frit.

The amount of $Ag_2O$ (B-1) is preferably 40 to 70% by mass, more preferably 45 to 70% by mass, further preferably 50 to 65% by mass; the amount of $V_2O_5$ (B-2) is preferably 10 to 40% by mass, more preferably 12 to 35% by mass, further preferably 15 to 30% by mass; the amount of $MoO_3$ (B-3) is preferably 4 to 10% by mass; and the amount of $TiO_2$ (B-4) is preferably 1 to 12% by mass, more preferably 2 to 10% by mass, further preferably 4 to 10% by mass.

When the glass frit substantially comprises $Ag_2O$ (B-1), $V_2O_5$ (B-2), $MoO_3$ (B-3), and MgO (B-4), it is preferred that $Ag_2O$ (B-1), $V_2O_5$ (B-2), $MoO_3$ (B-3), and MgO (B-4) have their respective compositions shown below, based on the mass of the glass frit.

The amount of $Ag_2O$ (B-1) is preferably 40 to 70% by mass, more preferably 45 to 70% by mass, further preferably 50 to 65% by mass; the amount of $V_2O_5$ (B-2) is preferably 10 to 40% by mass, more preferably 12 to 35% by mass, further preferably 15 to 30% by mass; the amount of $MoO_3$ (B-3) is preferably 4 to 10% by mass; and the amount of MgO (B-4) is preferably 1 to 12% by mass, more preferably 1 to 10% by mass, further preferably 2 to 8% by mass.

When the glass frit substantially comprises $Ag_2O$ (B-1), $V_2O_5$ (B-2), $MoO_3$ (B-3), and $Nb_2O_5$ (B-4), it is preferred that $Ag_2O$ (B-1), $V_2O_5$ (B-2), $MoO_3$ (B-3), and $Nb_2O_5$ (B-4) have their respective compositions shown below, based on the mass of the glass frit.

The amount of $Ag_2O$ (B-1) is preferably 40 to 70% by mass, more preferably 45 to 70% by mass, further preferably 50 to 65% by mass; the amount of $V_2O_5$ (B-2) is preferably 10 to 40% by mass, more preferably 12 to 35% by mass, further preferably 15 to 30% by mass; the amount of $MoO_3$ (B-3) is preferably 4 to 10% by mass; and the amount of $Nb_2O_5$ (B-4) is preferably 1 to 12% by mass, more preferably 1 to 10% by mass, further preferably 1 to 8% by mass.

When the glass frit substantially comprises $Ag_2O$ (B-1), $V_2O_5$ (B-2), $MoO_3$ (B-3), and BaO (B-4), it is preferred that $Ag_2O$ (B-1), $V_2O_5$ (B-2), $MoO_3$ (B-3), and BaO (B-4) have their respective compositions shown below, based on the mass of the glass frit.

The amount of $Ag_2O$ (B-1) is preferably 40 to 70% by mass, more preferably 45 to 70% by mass, further preferably 50 to 65% by mass; the amount of $V_2O_5$ (B-2) is preferably 10 to 40% by mass, more preferably 12 to 35% by mass, further preferably 15 to 30% by mass; the amount of $MoO_3$ (B-3) is preferably 4 to 10% by mass; and the amount of BaO (B-4) is preferably 1 to 12% by mass, more preferably 2 to 10% by mass, further preferably 1 to 2% by mass.

When the glass frit substantially comprises $Ag_2O$ (B-1), $V_2O_5$ (B-2), $MoO_3$ (B-3), and $Al_2O_3$ (B-4), it is preferred that $Ag_2O$ (B-1), $V_2O_5$ (B-2), $MoO_3$ (B-3), and $Al_2O_3$ (B-4) have their respective compositions shown below, based on the mass of the glass frit.

The amount of $Ag_2O$ (B-1) is preferably 40 to 70% by mass, more preferably 45 to 70% by mass, further preferably 50 to 65% by mass; the amount of $V_2O_5$ (B-2) is preferably 10 to 40% by mass, more preferably 12 to 35% by mass, further preferably 15 to 30% by mass; the amount of $MoO_3$ (B-3) is preferably 4 to 10% by mass, more preferably 5 to 8% by mass, further preferably 6 to 8% by mass; and the amount of $Al_2O_3$ (B-4) is preferably 0.5 to 12% by mass.

When the glass frit substantially comprises $Ag_2O$ (B-1), $V_2O_5$ (B-2), $MoO_3$ (B-3), and SnO (B-4), it is preferred that $Ag_2O$ (B-1), $V_2O_5$ (B-2), $MoO_3$ (B-3), and SnO (B-4) have their respective compositions shown below, based on the mass of the glass frit.

The amount of $Ag_2O$ (B-1) is preferably 40 to 70% by mass, more preferably 45 to 70% by mass, further preferably 50 to 65% by mass; the amount of $V_2O_5$ (B-2) is preferably 10 to 40% by mass, more preferably 12 to 35% by mass, further preferably 15 to 30% by mass; the amount of $MoO_3$ (B-3) is preferably 4 to 10% by mass; and the amount of SnO (B-4) is preferably 1 to 12% by mass.

When the glass frit substantially comprises $Ag_2O$ (B-1), $V_2O_5$ (B-2), $MoO_3$ (B-3), and $Fe_2O_3$ (B-4), it is preferred that $Ag_2O$ (B-1), $V_2O_5$ (B-2), $MoO_3$ (B-3), and $Fe_2O_3$ (B-4) have their respective compositions shown below, based on the mass of the glass frit.

The amount of $Ag_2O$ (B-1) is preferably 40 to 70% by mass, more preferably 45 to 70% by mass, further preferably 50 to 65% by mass; the amount of $V_2O_5$ (B-2) is preferably 10 to 40% by mass, more preferably 12 to 35% by mass, further preferably 15 to 30% by mass; the amount of $MoO_3$ (B-3) is preferably 4 to 10% by mass; and the amount of $Fe_2O_3$ (B-4) is preferably 1 to 12% by mass, more preferably 2 to 10% by mass, further preferably 2 to 8% by mass.

When the glass frit substantially comprises $Ag_2O$ (B-1), $V_2O_5$ (B-2), $MoO_3$ (B-3), ZnO (B-4), and CuO (B-4'), it is preferred that $Ag_2O$ (B-1), $V_2O_5$ (B-2), $MoO_3$ (B-3), ZnO (B-4), and CuO (B-4') have their respective compositions shown below, based on the mass of the glass frit.

The amount of $Ag_2O$ (B-1) is preferably 40 to 70% by mass, more preferably 45 to 70% by mass, further preferably 50 to 65% by mass; the amount of $V_2O_5$ (B-2) is preferably 10 to 40% by mass, more preferably 12 to 35% by mass, further preferably 15 to 30% by mass; the amount of $MoO_3$ (B-3) is preferably 4 to 10% by mass; the amount of ZnO (B-4) is preferably 1 to 12% by mass, more preferably 2 to 10% by mass, further preferably 2 to 8% by mass; and the amount of CuO (B-4') is preferably 1 to 10% by mass, more preferably 2 to 8% by mass, further preferably 2 to 6% by mass, and the mass ratio of ZnO (B-4) and CuO (B-4') {ZnO (B-4):CuO (B-4')} is preferably 10:1 to 1:10, more preferably 5:1 to 1:5, further preferably 3:1 to 1:3, especially preferably 2:1 to 1:2.

(C) Solvent

As a solvent, there can be used one type or two or more types of solvents selected from alcohols (for example, terpineol, α-terpineol, and β-terpineol), esters (for example, hydroxyl group-containing esters, such as 2,2,4-trimethyl-1,3-pentanediol monoisobutyrate and butyl carbitol acetate), paraffin mixtures (for example, Linpar, manufactured by Condea Chemie GmbH), and polyhydric alcohols (for example, 2-ethyl-1,3-hexanediol).

With respect to the solvent, for adjusting the viscosity of the conductive paste to that suitable for application, one type or two or more types of, for example, a resin, a binder, and a filler may be added to the solvent.

(D) Metal Oxide

It is preferred that the conductive paste of the present invention contains at least one metal oxide selected from the group consisting of SnO, ZnO, $In_2O_3$, and CuO. This metal oxide is not the oxide contained in the glass frit.

When the conductive paste contains at least one metal oxide selected from the group consisting of SnO, ZnO, $In_2O_3$, and CuO, the bond strength can be further improved, making it possible to obtain a semiconductor device which can maintain the bond strength even in an environment at a relatively high temperature (for example, at 300 to 350° C.).

Other Additives

In the conductive paste of the present invention, as another additive selected from, for example, a plasticizer, an anti-foaming agent, a dispersant, a leveling agent, a stabilizer, and an adhesion promoter can be further incorporated into the paste if necessary. Of the above plasticizer, one selected from, for example, phthalates, glycolates, phosphates, sebacates, adipates, and citrates can be used.

Conductive Paste

It is preferred that the conductive paste of the present invention contains conductive particles (A) in an amount of 60 to 90% by mass, glass frit (B) in an amount of 5 to 35% by mass, and solvent (C) in an amount of 5 to 12% by mass. The unit "% by mass" for the respective components indicates amounts of the respective components contained, based on the mass of the conductive paste (100% by mass).

When the conductive paste of the present invention contains conductive particles (A) in an amount of 60 to 90% by mass, glass frit (B) in an amount of 5 to 35% by mass, and solvent (C) in an amount of 5 to 12% by mass, by heating the conductive paste to the remelting temperature (Tr) of glass frit (B) or higher, the conductive particles are diffused through the molten conductive paste to suffer deposition, making it possible to form a calcined film having excellent conductive properties. The conductive paste of the present invention can electrically connect adherends (for example, a substrate and a semiconductor chip) to each other.

When the conductive paste of the present invention contains metal oxide (D), it is preferred that the conductive paste contains conductive particles (A) in an amount of 60 to 85% by mass, glass frit (B) in an amount of 5 to 35% by mass, solvent (C) in an amount of 5 to 10% by mass, and metal oxide (D) in an amount of 0 to 5% by mass. Further, it is more preferred that the conductive paste of the present invention contains conductive particles (A) in an amount of 60 to 85% by mass, glass frit (B) in an amount of 5 to 35% by mass, solvent (C) in an amount of 5 to 10% by mass, and metal oxide (D) in an amount of 0.1 to 5% by mass. The unit "% by mass" for the respective components indicates amounts of the respective components contained, based on the mass of the conductive paste (100% by mass).

When the conductive paste contains conductive particles (A) in an amount of 60 to 85% by mass, glass frit (B) in an amount of 5 to 35% by mass, solvent (C) in an amount of 5 to 10% by mass, and metal oxide (D) in an amount of 0 to 5% by mass, by heating the conductive paste to the remelting temperature (Tr) of glass frit (B) or higher, the conductive particles are diffused through the molten conductive paste to suffer deposition, making it possible to form a calcined film having excellent conductive properties. The conductive paste of the present invention can electrically connect adherends (for example, a substrate and a semiconductor chip) to each other.

In the conductive paste of the present invention, the mass ratio of conductive particles (A) and glass frit (B) {conductive particles (A):glass frit (B)} is preferably 50:50 to 98:2, more preferably 60:40 to 90:10, further preferably 65:35 to 85:15, especially preferably 70:30 to 80:20. When the mass ratio of conductive particles (A) and glass frit (B) {conductive particles (A):glass frit (B)} is 50:50 to 98:2, by heating the conductive paste to the remelting temperature (Tr) of glass frit (B) or higher, the conductive particles are diffused through the molten conductive paste to suffer deposition, making it possible to form a calcined film having excellent conductive properties. The conductive paste of the present invention can electrically connect adherends (for example, a substrate and a semiconductor chip) to each other.

The method for producing the conductive paste of the present invention is described below.

[Method for Producing the Conductive Paste]

The method for producing the conductive paste of the present invention has a step for mixing conductive particles, a glass frit, and a solvent with one another. For example, the conductive paste can be produced by adding to a solvent conductive particles, a glass frit, and optionally another additive and/or additive particles, and mixing and dispersing them in the solvent.

Mixing can be performed by means of, for example, a planetary mixer. Dispersing can be performed by means of a three-roll mill. The methods for mixing and dispersing are not limited to these methods, and various known methods can be used.

Hereinbelow, a method for producing a semiconductor device using the conductive paste of the present invention is described.

[Method (1) for producing a semiconductor device]

The method of the present invention for producing a semiconductor device comprises the steps of: applying the conductive paste of the present invention to a substrate and/or a semiconductor chip; placing the semiconductor chip on the substrate through the conductive paste; heating the conductive paste to the remelting temperature of glass frit (B) contained in the conductive paste or higher to sinter conductive particles (A) contained in the conductive paste so that the semiconductor chip and the substrate are electrically connected to each other; and gradually cooling the conductive paste.

In the method of the present invention for producing a semiconductor device, a substrate and a semiconductor chip are placed through the conductive paste and the conductive paste is heated to the remelting temperature (Tr) of glass frit (B) contained in the conductive paste or higher, so that the glass frit is molten in the conductive paste and further the conductive particles are diffused through the conductive paste and sintered to exhibit excellent conductive properties, making it possible to electrically connect the substrate and the semiconductor chip to each other.

FIG. 1 is a diagram showing the steps in an embodiment of the method of the present invention for producing a semiconductor device. FIG. 1(a) shows an example of the method of applying conductive paste 1 to a semiconductor chip. As shown in FIG. 1(a), gap 2 for containing the conductive paste is formed using polyimide tapes at the ends of semiconductor chip 3. Conductive paste 1 is applied to semiconductor chip 3 by dispensing the paste onto the surface of the semiconductor chip using, for example, a mechanical dispenser (manufactured by Musashi Engineering, Inc.). The method of applying the conductive paste of the present invention is not limited to the dispensing or printing method, and the conductive paste of the present invention can be applied by other methods.

FIG. 1(b) shows the state in which semiconductor chip 3 is placed on substrate 4 through conductive paste 1. FIG. 1(c) shows the state in which conductive paste 1 bonding semiconductor chip 3 to substrate 4 is calcined. As shown in FIG. 1(b), semiconductor chip 3 is placed on substrate 4 through conductive paste 1. As shown in FIG. 1(c), conductive paste 1 is then calcined using, for example, a reflow oven. Conductive paste 1 is heated to the remelting temperature of the glass frit contained in conductive paste 1 or higher. In conductive paste 1, the conductive particles contained in conductive paste 1 are sintered, so that calcined film 1' electrically connecting semiconductor chip 3 and substrate 4 to each other is obtained. The conductive paste is calcined by, for example, inserting the substrate, conductive paste, and semiconductor chip into, for example, a reflow oven, and elevating the temperature to 350 to 400° C. at a temperature elevation rate of 5 to 20° C./min using a heat lamp at 5 to 20° C. and performing calcination for 1 to 30 minutes. The substrate, conductive paste, and semiconductor chip are preferably calcined at a temperature of 370° C. or lower at a temperature elevation rate of 15 to 20° C./min for 5 to 10 minutes. For example, when the remelting temperature of the glass frit is 360° C., calcination at a temperature of higher than 360 to 370° C. for 5 to 10 minutes is preferably performed. Then, the substrate, conductive paste, and semiconductor chip are removed from the reflow oven, and gradually cooled.

FIG. 1(d) shows semiconductor device 5. As shown in FIG. 1(d), semiconductor chip 3 and substrate 4 are electrically connected to each other due to calcined film 1' obtained by calcining the conductive paste, so that semiconductor device 5 is produced. Calcined film 1' formed between semiconductor chip 3 and substrate 4 contains silver deposited in calcined film 1' and crystallized glass caused by crystallization of part of the glass frit. By virtue of the silver deposited in calcined film 1', the semiconductor chip and the substrate are electrically connected to each other by calcined film 1'. Further, by virtue of the silver deposited in calcined film 1' and crystallized glass in calcined film 1', semiconductor device 5 having the semiconductor chip and the substrate bonded by calcined film 1' can maintain the bond strength between semiconductor chip 3 and substrate 4 even when placed in an environment at a relatively high temperature (for example, at 300 to 350° C.).

[Method (2) for Producing a Semiconductor Device]

The method of the present invention for producing a semiconductor device comprises the steps of: applying the conductive paste of the present invention to a substrate and/or a semiconductor chip; placing the semiconductor chip on the substrate through the conductive paste; heating the conductive paste to reduce $Ag_2O$ (B-1) in glass frit (B) contained in the conductive paste; further heating the conductive paste to the remelting temperature of glass frit (B) contained in the conductive paste or higher; and gradually cooling the conductive paste to cause crystals to be precipitated.

In the method of the present invention for producing a semiconductor device, a substrate and a semiconductor chip are placed through the conductive paste and the conductive paste is heated, so that $Ag_2O$ (B-1) in glass frit (B) contained in the conductive paste is reduced. $Ag_2O$ has a reducing temperature of about 140 to 200° C.

The conductive paste is heated to the temperature at which $Ag_2O$ is reduced or higher (at a temperature of higher than about 200° C.) to reduce $Ag_2O$, causing silver (Ag) contained in glass frit (B) to suffer deposition. The conductive paste is further heated to the remelting temperature of the glass frit contained in the conductive paste or higher (for example, at 370° C. or lower; for example, when the remelting temperature of the glass frit is 360° C., at a temperature of higher than 360 to 370° C.), so that the glass frit in the conductive paste is molten. Then, the conductive paste is gradually cooled to obtain a calcined film. In the calcined film, silver derived from the glass frit contained in the conductive paste suffers deposition. Further, in the calcined film, the silver as well as crystallized glass caused by recrystallization of part of the glass frit suffer deposition.

The method for producing a semiconductor device using the conductive paste of the present invention is unlikely to thermally affect the adherends. In the method for producing a semiconductor device using the conductive paste of the present invention, adherends can be bonded together at a temperature which is the remelting temperature of the glass frit contained in the conductive paste or higher and whish is a low temperature such that the heat energy consumption can be reduced (for example, at 370° C. or lower; for example, when the remelting temperature of the glass frit is 360° C., at a temperature of higher than 360 to 370° C.). Further, in the method of the present invention, after bonding, the conductive paste is heated and cooled and, in the resultant calcined film, silver and crystals derived from the glass frit contained in the conductive paste suffer deposition. In the calcined film, silver and crystals derived from the glass frit contained in the conductive paste suffer deposition, and therefore the melting temperature of the calcined film tends to be higher than the remelting temperature (Tr) of the glass frit. The calcined film can maintain the bond strength between the semiconductor chip and the substrate even in an environment at a relatively high temperature (for example, at 300 to 350° C.). The conductive paste of the present invention and the method for producing a semiconductor device using the same can be advantageously used in a die attach material for bonding a SiC semiconductor chip having a high junction temperature, as compared to a silicon (Si) semiconductor chip. Further, the conductive paste of the present invention and the method for producing a semiconductor device using the same can reduce the heat energy consumption for bonding, and further can provide a semiconductor device which can maintain the bond strength even when placed in an environment at a relatively high temperature (for example, at 300 to 350° C.). By the conductive paste of the present invention and the method for producing a semiconductor device using the same, there can be provided a semiconductor device having excellent thermal cycling properties and excellent storage properties in a high-temperature environment as well as high reliability.

By the conductive paste of the present invention and the method for producing a semiconductor device using the same, various combinations of chips and substrates can be bonded to each other. As an example of a combination of a semiconductor chip (die) and a substrate which can be bonded by the present invention, there can be mentioned a combination of a chip having a non-metallized surface and a substrate having a non-metallized surface. Examples of such combinations include a combination of a Si chip (die) and a Si substrate, a combination of a SiC chip (die) and a Si substrate, and a combination of a Si chip and a ceramic ($Al_2O_3$) substrate.

As another example of the combination of a semiconductor chip (die) and a substrate, there can be mentioned a combination of a chip having a metallized surface and a substrate having a metallized surface. Examples of such combinations include a combination of a Au-plated SiC chip (die) and a Au-plated substrate, and a combination of a Au- or Ag-plated Si chip and a Ag-plated copper substrate.

As a further example of the combination of a semiconductor chip (die) and a substrate, there can be mentioned a combination of a chip having a metallized surface and a substrate having a non-metallized surface. Examples of such combinations include a combination of a Au-plated Si chip and a ceramic ($Al_2O_3$) substrate.

In the conductive paste of the present invention and the method for producing a semiconductor device using the same, the method of applying the conductive paste to a substrate is not limited to dispending or printing, and various methods conventionally known can be used.

In the conductive paste and method of the present invention, the temperature elevation to, for example, 370° C. can be performed under atmospheric pressure in an atmosphere which is not limited to an inert gas atmosphere, such as a nitrogen gas atmosphere.

By the conductive paste and method of the present invention, a semiconductor chip and a substrate can be bonded to each other without applying a pressure from the outside or applying a load from the outside to the semiconductor chip.

EXAMPLES

The glass frit is first described below. The glass frit used in the conductive paste of the present invention is not limited by the following Examples.

[Glass Frit]

Table 1 shows a glass frit substantially comprising $Ag_2O$ (B-1), $V_2O_5$ (B-2), and $MoO_3$ (B-3), and a glass frit substantially comprising $Ag_2O$ (B-1), $V_2O_5$ (B-2), $MoO_3$ (B-3), and ZnO (B-4). Table 2 shows a glass frit substantially comprising $Ag_2O$ (B-1), $V_2O_5$ (B-2), $MoO_3$ (B-3), and one oxide (B-4) of $TiO_2$, MgO, $Nb_2O_5$, BaO, $Al_2O_3$, SnO, and $Fe_2O_3$. Table 3 shows a glass frit substantially comprising $Ag_2O$ (B-1), $V_2O_5$ (B-2), $MoO_3$ (B-3), and CuO (B-4), and a glass frit substantially comprising $Ag_2O$ (B-1), $V_2O_5$ (B-2), $MoO_3$ (B-3), ZnO (B-4), and CuO (B-4'). In Tables 1 to 3, the values shown for components (B-1) to (B-4) are expressed in % by mass.

The method for producing the glass frit is as follows.

As raw materials for the glass frit, oxide powders shown in Tables 1 to 3 were weighed and mixed together, and placed in a crucible (for example, a porcelain crucible, manufactured by Fisher Brand; high temperature porcelain; size: 10 mL). The crucible containing therein the raw materials for glass frit was placed in an oven (oven; manufactured by JELENKO, JEL-BURN JM, MODEL: 335300). The temperature of the raw materials for glass frit was elevated in the oven to the melt temperature indicated at the column "Melt Temp" shown in each of Tables 1 to 3, and the melt temperature was maintained so that the raw materials were satisfactorily molten. Then, the crucible containing therein the molten raw materials for glass frit was removed from the oven, and the molten raw materials for glass frit were uniformly stirred. Subsequently, the molten raw materials for glass frit were placed on two rolls made of stainless steel having a diameter of 1.86 inch and rotating at room temperature, and the two rolls were rotated by a motor (BODUNE. D,C. MOTOR 115 V) to knead the molten raw materials for glass frit while quickly cooing at room temperature, forming sheet-form glass. Finally, the sheet-form glass was ground using a mortar and rendered in a uniformly dispersed state, and subjected to sieve classification using a 100-mesh sieve and a 200-mesh sieve to produce a sieved glass frit. By performing sieve classification so that the glass frit was passed through the 100-mesh sieve and remained on the 200-mesh sieve, the glass frit having an average particle diameter of 149 μm (median diameter) was obtained. By appropriately selecting the mesh size of the sieve used for glass frit, the glass frit having a larger average particle diameter or a smaller average particle diameter can be obtained.

With respect to each of the glass frits, a DSC curve was measured using a differential scanning calorimeter under the conditions shown below. A glass transition temperature (Tg), a crystallization temperature (Tc), and a remelting temperature (Tr) were determined from the DSC curve as measured by a differential scanning calorimeter. The glass transition temperature (Tg), crystallization temperature (Tc), and remelting temperature (Tr) of each glass frit are shown in Tables 1 to 3.

[Glass Transition Temperature (Tg)]

With respect to the glass frit, a DSC curve in the temperature region of from about 50 to about 370° C. was measured using a differential scanning calorimeter DSC-50, manufactured by SHIMADZU Corporation, under conditions such that the temperature was elevated to 370° C. at a temperature elevation rate of 15° C./min. A glass transition temperature (Tg) was determined from the temperature at the first point of inflection in the DSC curve. When no point of inflection was recognized, symbol "-" indicating unmeasurable was shown in the table.

[Crystallization Temperature (Tc)]

A crystallization temperature (Tc) was determined as a temperature indicated by the peak top of at least one exothermic peak having an exotherm of 20 J/g or more in a DSC curve, as measured using a differential scanning calorimeter (DSC-50, manufactured by SHIMADZU Corporation) under conditions such that the temperature was elevated to 370° C. at a temperature elevation rate of 15° C./min. When a plurality of exothermic peaks appeared, the temperature (° C.) at the peak top of the first exothermic peak was indicated by TC1, the temperature (° C.) at the peak top of the second exothermic peak was indicated by TC2, and the temperature (° C.) at the peak top of the third exothermic peak was indicated by TC3.

[Remelting Temperature (Tr)]

A remelting temperature (Tr) was determined as a temperature indicated by the peak top of at least one endothermic peak having an endotherm of (–) 20 J/g or more in a DSC curve, as measured using a differential scanning calorimeter (DSC-50, manufactured by SHIMADZU Corporation) under conditions such that the temperature was elevated to 370° C. at a temperature elevation rate of 15° C./min. When a plurality of endothermic peaks appeared, the temperature (° C.) at the peak top of the first endothermic peak was indicated by TR1, the temperature (° C.) at the peak top of the second endothermic peak was indicated by TR2, and the temperature (° C.) at the peak top of the third endothermic peak was indicated by TR3. When the peak top of endothermic peak was not able to be measured, symbol "-" indicating unmeasurable was shown in the table.

The obtained glass frits were individually visually observed, and evaluated according to the following criteria: Excellent: The glass frit is satisfactorily homogeneous; Good: The glass frit is homogeneous; Fair: The glass frit is slightly heterogeneous; and void: A void is visually recognized in the glass frit. The results are shown in Tables 1 to 3.

TABLE 1

| | | 1 | Reference 1 | 13 | 14 | 15 | 16 | 22 |
|---|---|---|---|---|---|---|---|---|
| | No | SC112-4 | SC103-1 | SC140-4 | SC141-4 | SC142-4 | SC143-4 | SC176-4 |
| | Lot | | 52511 | 61611 | 61611 | 61611 | 61611 | 71211 |
| | mesh | 100/200 | 100/200 | 100/200 | 100/200 | 100/200 | 100/200 | 100/200 |
| (B-1) | $Ag_2O$ | 63.40 | 61.70 | 62.73 | 62.04 | 60.67 | 57.93 | 56.56 |
| (B-2) | $V_2O_5$ | 29.10 | 28.30 | 28.77 | 28.46 | 27.83 | 26.57 | 25.94 |
| (B-3) | $MoO_3$ | 7.5 | 10.00 | 7.50 | 7.50 | 7.50 | 7.50 | 7.50 |
| (B-4) | ZnO | | | 1.00 | 2.00 | 4.00 | 8.00 | 10.00 |
| | CuO | | | | | | | |
| | $TiO_2$ | | | | | | | |
| | $SiO_2$ | | | | | | | |
| | $Bi_2O_3$ | | | | | | | |
| | $Al_2O_3$ | | | | | | | |
| | SnO | | | | | | | |
| | $MnO_2$ | | | | | | | |

(column headers row: glass flit No.)

TABLE 1-continued

| | | | | | | | | |
|---|---|---|---|---|---|---|---|---|
| | MgO | | | | | | | |
| | Nb$_2$O$_5$ | | | | | | | |
| | Fe$_2$O$_3$ | | | | | | | |
| | BaO | | | | | | | |
| Othes | TeO$_2$ | | | | | | | |
| | Sb$_2$O$_3$ | | | | | | | |
| | Total | 100.0 | 100.00 | 100.00 | 100.00 | 100.00 | 100.00 | 100.00 |
| | Ag$_2$O/V$_2$O$_5$ | 2.18 | 2.18 | 2.18 | 2.18 | 2.18 | 2.18 | 2.18 |
| | Melt Temp | 700 | 600 | 700 | 700 | 700 | 700 | 700 |
| | Dwell at melting temp. | 15 | 15 | 15 | 15 | 15 | 15 | 15 |
| | Preheat Temp | 550 | 550 | 550 | 550 | 550 | 550 | 550 |
| | Precrystallize | — | — | — | — | — | — | — |
| | Tg | 147.16 | 152.84 | 149.23 | 150.62 | 154.03 | 160.2 | 159.5 |
| | TC1 − Tg | 25.88 | 26.13 | 32.93 | 44.84 | 71.72 | 80 | 68.09 |
| | TC1 | 173.04 | 178.97 | 182.16 | 195.46 | 225.75 | 240.2 | 227.59 |
| | TC1 (J/g) | 31.13 | 31.12 | 37.56 | 38.61 | 43.22 | 50.58 | 36.72 |
| | TC2 | | | | | 294.36 | 297.88 | 256.23 |
| | TC2 (J/g) | | | | | 2.94 | 0.96 | 2.48 |
| | TC3 | | | | | | | 287.23 |
| | TC3 (J/g) | | | | | | | 0.53 |
| | TR1 | 351.23 | 361.92 | 341.45 | 352.09 | 342.08 | 342.74 | 341.67 |
| | TR1 (J/g) | −49.43 | −27.56 | −43.54 | −37.77 | −46.48 | −38.36 | −31.46 |
| | TR2 | | | | | 384.15 | | |
| | TR2 (J/g) | | | | | −15.98 | | |
| | TR3 | | | | | | | |
| | TR3 (J/g) | | | | | | | |
| | Comments | | | | | | | |
| | bach size | 10 g | 10 g | 10 g | 10 g | 10 g | 10 g | 10 g |
| | Melt pour | GOOD | Good | Excellent | Excellent | Excellent | Excellent | good void |

| | | glass flit No. | | | | | | |
|---|---|---|---|---|---|---|---|---|
| | | 23 | 24 | 25 | 26 | 27 | 28 | Reference 7 |
| | No | SC177-4 | SC230-4 | SC181-4 | SC183-4 | SC182-4 | SC184-4 | SC223-4 |
| | Lot | 71211 | 81111 | 71411 | 71411 | 71411 | 71411 | 80511 |
| | mesh | 100/200 | 100/200 | 100/200 | 100/200 | 100/200 | 100/200 | 100/200 |
| (B-1) | Ag$_2$O | 55.19 | 64.44 | 63.07 | 58.96 | 60.33 | 56.21 | 54.84 |
| (B-2) | V$_2$O$_5$ | 25.31 | 29.56 | 28.93 | 27.04 | 27.67 | 25.79 | 25.16 |
| (B-3) | MoO$_3$ | 7.50 | 4.00 | 4.00 | 10.00 | 4.00 | 10.00 | 12.00 |
| (B-4) | ZnO | 12.00 | 2.00 | 4.00 | 4.00 | 8.00 | 8.00 | 8.00 |
| | CuO | | | | | | | |
| | TiO$_2$ | | | | | | | |
| | SiO$_2$ | | | | | | | |
| | Bi$_2$O$_3$ | | | | | | | |
| | Al$_2$O$_3$ | | | | | | | |
| | SnO | | | | | | | |
| | MnO$_2$ | | | | | | | |
| | MgO | | | | | | | |
| | Nb$_2$O$_5$ | | | | | | | |
| | Fe$_2$O$_3$ | | | | | | | |
| | BaO | | | | | | | |
| Othes | TeO$_2$ | | | | | | | |
| | Sb$_2$O$_3$ | | | | | | | |
| | Total | 100.00 | 100.00 | 100.00 | 100.00 | 100.00 | 100.00 | 100.00 |
| | Ag$_2$O/V$_2$O$_5$ | 2.18 | 2.18 | 2.18 | 2.18 | 2.18 | 2.18 | 2.18 |
| | Melt Temp | 700 | 700 | 700 | 700 | 700 | 700 | 700 |
| | Dwell at melting temp. | 15 | 15 | 15 | 15 | 15 | 15 | 15 |
| | Preheat Temp | 550 | 550 | 550 | 550 | 550 | 550 | 550 |
| | Precrystallize | — | — | — | — | — | — | — |
| | Tg | 161.63 | 139.87 | 144.69 | 161.12 | 152.74 | 167.88 | 172.5 |
| | TC1 − Tg | 62.27 | 53.06 | 62.29 | 73.97 | 64.16 | 87.11 | 75.21 |
| | TC1 | 223.9 | 192.93 | 206.98 | 235.09 | 216.9 | 254.99 | 247.71 |
| | TC1 (J/g) | 34.59 | 32.42 | 42.24 | 47.74 | 37.15 | 51.86 | 48.32 |
| | TC2 | 254.12 | 305.78 | 303.17 | | 265.45 | 295.49 | |
| | TC2 (J/g) | 3.46 | 11.77 | 2.09 | | 3.54 | 0.91 | |
| | TC3 | | | | | | | |
| | TC3 (J/g) | | | | | | | |
| | TR1 | 341.61 | 352.7 | 343.64 | 341.49 | 351.75 | 342.31 | 340.27 |
| | TR1 (J/g) | −31.1 | −68.62 | −66.86 | −43.66 | −54.15 | −78.99 | −9.18 |
| | TR2 | | | | | | | 365.31 |
| | TR2 (J/g) | | | | | | | −2.86 |
| | TR3 | | | | | | | 391.02 |
| | TR3 (J/g) | | | | | | | −26.93 |
| | Comments | | | | | | | |
| | bach size | 10 g | 10 g | 10 g | 10 g | 10 g | 10 g | 10 g |
| | Melt pour | Excellent | Excellent | Excellent | Excellent | Excellent | Excellent | Good + void |

TABLE 1-continued

| | | glass flit No. | | | | | |
|---|---|---|---|---|---|---|---|
| | | Reference 10 | 37 | Reference 11 | 38 | Reference 12 | Reference 13 |
| | No | SC316-4 | SC317-4 | SC318-4 | SC322-4 | SC185-4 | SC215-4 |
| | Lot | 102312 | 101812 | 101812 | 102312 | 62111 | 72811 |
| | mesh | 100/200 | 100/200 | 100/200 | 100/200 | 100/200 | 100/200 |
| (B-1) | $Ag_2O$ | 52.71 | 59.22 | 62.48 | 54.20 | 65.81 | 60.67 |
| (B-2) | $V_2O_5$ | 29.29 | 22.78 | 19.52 | 27.80 | 30.19 | 27.83 |
| (B-3) | $MoO_3$ | 10.00 | 10.00 | 10.00 | 10.00 | | 7.50 |
| (B-4) | ZnO | 8.00 | 8.00 | 8.00 | 8.00 | | |
| | CuO | | | | | | |
| | $TiO_2$ | | | | | | |
| | $SiO_2$ | | | | | | |
| | $Bi_2O_3$ | | | | | | |
| | $Al_2O_3$ | | | | | | |
| | SnO | | | | | | |
| | $MnO_2$ | | | | | | |
| | MgO | | | | | | |
| | $Nb_2O_5$ | | | | | | |
| | $Fe_2O_3$ | | | | | | |
| | BaO | | | | | | |
| Othes | $TeO_2$ | | | | | 4.00 | |
| | $Sb_2O_3$ | | | | | | 4.00 |
| | Total | 100.00 | 100.00 | 100.00 | 100.00 | 100.00 | 100.00 |
| | $Ag_2O/V_2O_5$ | 1.80 | 2.60 | 3.20 | 1.95 | 2.18 | 2.18 |
| | Melt Temp | 700 | 700 | 700 | 700 | 700 | 700 |
| | Dwell at melting temp. | 15 | 15 | 15 | 15 | 15 | 15 |
| | Preheat Temp | 550 | 550 | 550 | 550 | 550 | 550 |
| | Precrystallize | — | — | — | — | — | — |
| | Tg | 181.2 | 159.75 | 145.97 | 178.12 | 125.96 | 161.39 |
| | TC1 − Tg | 70.15 | 54.44 | 41.31 | 76.15 | 37.49 | 22 |
| | TC1 | 251.35 | 214.19 | 187.28 | 254.27 | 163.45 | 183.39 |
| | TC1 (J/g) | 56.01 | 43.62 | 12.25 | 52.33 | 36.4 | 21 |
| | TC2 | | 313.91 | 267.61 | 296.64 | 255.98 | 304.02 |
| | TC2 (J/g) | | 7.22 | 3.12 | 0.27 | 4.04 | 4.18 |
| | TC3 | | | 290.06 | | | |
| | TC3 (J/g) | | | 8.74 | | | |
| | TR1 | 340.61 | 344.55 | 416.17 | 341.05 | 304.99 | — |
| | TR1 (J/g) | −15.98 | −32.06 | −7.09 | −38.08 | −16.53 | — |
| | TR2 | | | 460.79 | | 359.11 | |
| | TR2 (J/g) | | | −18.47 | | −46.21 | |
| | TR3 | | | | | | |
| | TR3 (J/g) | | | | | | |
| | Comments | | | | | | |
| | bach size | 10 g | 10 g | 10 g | 10 g | 10 g | 10 g |
| | Melt pour | Excellent | Fair + void | good | Excellent | Excellent | Fair |

TABLE 2

| | | glass flit No. | | | | | | |
|---|---|---|---|---|---|---|---|---|
| | | 2 | 3 | 4 | 5 | 6 | Reference 2 | 7 |
| | No | SC120-4 | SC122-4 | SC123-4 | SC134-4 | SC135-4 | SC127-4 | SC173-4 |
| | Lot | 060211 | 060211 | 060211 | 061411 | 061411 | 060211 | 071211 |
| | mesh | 100/200 | 100/200 | 100/200 | 100/200 | 100/200 | 100/200 | 100/200 |
| (B-1) | $Ag_2O$ | 62.73 | 62.73 | 62.04 | 60.67 | 57.93 | 62.04 | 60.67 |
| (B-2) | $V_2O_5$ | 28.77 | 28.77 | 28.46 | 27.83 | 26.57 | 28.46 | 27.83 |
| (B-3) | $MoO_3$ | 7.50 | 7.50 | 7.50 | 7.50 | 7.50 | 7.50 | 7.50 |
| (B-4) | ZnO | | | | | | | |
| | CuO | | | | | | | |
| | $TiO_2$ | | | | | | 2.00 | 4.00 |
| | $SiO_2$ | | | | | | | |
| | $Bi_2O_3$ | | | | | | | |
| | $Al_2O_3$ | | | | | | | |
| | SnO | 1.00 | | | | | | |
| | $MnO_2$ | | | | | | | |
| | MgO | | | | | | | |
| | $Nb_2O_5$ | | 1.00 | 2.00 | 4.00 | 8.00 | | |
| | $Fe_2O_3$ | | | | | | | |
| | BaO | | | | | | | |
| Others | $TeO_2$ | | | | | | | |
| | $Sb_2O_3$ | | | | | | | |
| | Total | 100.00 | 100.00 | 100.00 | 100.00 | 100.00 | 100.00 | 100.00 |

TABLE 2-continued

|  | | | | | | | |
|---|---|---|---|---|---|---|---|
| Ag$_2$O/V$_2$O$_5$ | 2.18 | 2.18 | 2.18 | 2.18 | 2.18 | 2.18 | 2.18 |
| Melt Temp | 700 | 700 | 700 | 700 | 700 | 700 | 700 |
| Dwell at melting temp. | 15 | 15 | 15 | 15 | 15 | 15 | 15 |
| Preheat Temp | 550 | 550 | 550 | 550 | 550 | 550 | 550 |
| Precrystallize | — | — | — | — | — | — | — |
| Tg | 149.4 | 151.47 | 156.2 | 164.63 | 174.88 | 151.88 | 146.91 |
| TC1 − Tg | 23.99 | 30.08 | 33.62 | 58.05 | 40.95 | 29.59 | 28.09 |
| TC1 | 173.39 | 181.55 | 189.82 | 222.68 | 215.83 | 181.47 | 175 |
| TC1 (J/g) | 33.67 | 33.71 | 34.2 | 35.69 | 29.72 | 32.04 | 32.33 |
| TC2 | 289.15 | | | | | | 286.23 |
| TC2 (J/g) | 2.69 | | | | | | 3.43 |
| TC3 | | | | | | | |
| TC3 (J/g) | | | | | | | |
| TR1 | 349.34 | 356.6 | 338.87 | 358.4 | 359.21 | 365.38 | 352.87 |
| TR1 (J/g) | −38.7 | −42.6 | −23.47 | −30.67 | −25.99 | −39.99 | −44.51 |
| TR2 | | | 396.4 | 411.03 | 416.87 | | |
| TR2 (J/g) | | | −28.65 | −21.84 | −31.71 | | |
| TR3 | | | | | | | |
| TR3 (J/g) | | | | | | | |
| Comments | | | | | | | |
| bach size | 10 g | 10 g | 10 g | 10 g | 10 g | 10 g | 10 g |
| Melt pour | | Good | Good | Excellent | Fair + void | Good | Good |

| | | glass flit No. | | | | | |
|---|---|---|---|---|---|---|---|
| | | Reference 3 | 8 | 9 | 10 | Reference 4 | 11 | 12 |
| | No | SC128-4 | SC129-4 | SC157-5 | SC158-5 | SC130-4 | SC131-4 | SC132-4 |
| | Lot | 060611 | 060611 | 062011 | 062011 | 060611 | 060611 | 061411 |
| | mesh | 100/200 | 100/200 | 100/200 | 100/200 | 100/200 | 100/200 | 100/200 |
| (B-1) | Ag$_2$O | 62.73 | 62.04 | 61.36 | 60.67 | 62.73 | 62.04 | 60.67 |
| (B-2) | V$_2$O$_5$ | 28.77 | 28.46 | 28.14 | 27.83 | 28.77 | 28.46 | 27.83 |
| (B-3) | MoO$_3$ | 7.50 | 7.50 | 7.50 | 7.50 | 7.50 | 7.50 | 7.50 |
| (B-4) | ZnO | | | | | | | |
| | CuO | | | | | | | |
| | TiO$_2$ | | | | | | | |
| | SiO$_2$ | | | | | | | |
| | Bi$_2$O$_3$ | | | | | | | |
| | Al$_2$O$_3$ | | | | | | | |
| | SnO | | | | | | | |
| | MnO$_2$ | | | | | | | |
| | MgO | 1.00 | 2.00 | 3.00 | 4.00 | | | |
| | Nb$_2$O$_5$ | | | | | | | |
| | Fe$_2$O$_3$ | | | | | 1.00 | 2.00 | 4.00 |
| | BaO | | | | | | | |
| Others | TeO$_2$ | | | | | | | |
| | Sb$_2$O$_3$ | | | | | | | |
| | Total | 100.00 | 100.00 | 100.00 | 100.00 | 100.00 | 100.00 | 100.00 |
| | Ag$_2$O/V$_2$O$_5$ | 2.18 | 2.18 | 2.18 | 2.18 | 2.18 | 2.18 | 2.18 |
| | Melt Temp | 700 | 700 | 800 | 800 | 700 | 700 | 700 |
| | Dwell at melting temp. | 15 | 15 | 15 | 15 | 15 | 15 | 15 |
| | Preheat Temp | 550 | 550 | 550 | 550 | 550 | 550 | 550 |
| | Precrystallize | — | — | — | — | — | — | — |
| | Tg | 155 | 161.66 | 178.6 | 190.91 | 153.5 | 158.26 | 158.86 |
| | TC1 − Tg | 47.1 | 74.97 | 89.75 | 74.54 | 26.05 | 51.2 | 49.98 |
| | TC1 | 202.1 | 236.63 | 268.35 | 265.45 | 179.55 | 209.46 | 208.84 |
| | TC1 (J/g) | 35.58 | 45.29 | 37.7 | 31.56 | 35.38 | 36.43 | 37.51 |
| | TC2 | 341.51 | 305.08 | 300.98 | 302.63 | | 280.71 | |
| | TC2 (J/g) | 3.71 | 1.92 | 0.79 | 0.63 | | 1.31 | |
| | TC3 | | | | | | | |
| | TC3 (J/g) | | | | | | | |
| | TR1 | 360.87 | 358.61 | 352.43 | 352.95 | 374.35 | 346.01 | 344.86 |
| | TR1 (J/g) | −32.35 | −30.25 | −31.12 | −25.94 | −78.97 | −56.15 | −70.52 |
| | TR2 | 416.32 | 410.01 | 400.51 | 401.27 | | | |
| | TR2 (J/g) | −5.98 | −4.5 | −5.7 | −4.12 | | | |
| | TR3 | | | | | | | |
| | TR3 (J/g) | | | | | | | |
| | Comments | | | | | | | |
| | bach size | 10 g | 10 g | 10 g | 10 g | 10 g | 10 g | 10 g |
| | Melt pour | Good | Good | Excellent | Excellent | Good | Good | Fair |

| | | glass flit No. | | | | | |
|---|---|---|---|---|---|---|---|
| | | 20 | 21 | Reference 6 | Reference 8 | 31 | Reference 9 |
| | No | SC153-4 | SC154-4 | SC155-4 | SC106-1 | SC100-1 | SC101-1 |
| | Lot | 061711 | 061711 | 062011 | 052611 | 052311 | 052311 |
| | mesh | 100/200 | 100/200 | 100/200 | 100/200 | 100/200 | 100/200 |
| (B-1) | Ag$_2$O | 62.73 | 62.04 | 60.67 | 64.78 | 63.10 | 61.40 |

TABLE 2-continued

|  |  |  | | | | | | |
|---|---|---|---|---|---|---|---|---|
|  | (B-2) | $V_2O_5$ | 28.77 | 28.46 | 27.83 | 29.72 | 28.90 | 28.10 |
|  | (B-3) | $MoO_3$ | 7.50 | 7.50 | 7.50 | 5.00 | 7.50 | 10.00 |
|  | (B-4) | ZnO | | | | | | |
|  |  | CuO | | | | | | |
|  |  | $TiO_2$ | | | | | | |
|  |  | $SiO_2$ | | | | | | |
|  |  | $Bi_2O_3$ | | | | | | |
|  |  | $Al_2O_3$ | | | | 0.50 | 0.50 | 0.50 |
|  |  | SnO | | | | | | |
|  |  | $MnO_2$ | | | | | | |
|  |  | MgO | | | | | | |
|  |  | $Nb_2O_5$ | | | | | | |
|  |  | $Fe_2O_3$ | | | | | | |
|  |  | BaO | 1.00 | 2.00 | 4.00 | | | |
|  | Others | $TeO_2$ | | | | | | |
|  |  | $Sb_2O_3$ | | | | | | |
|  |  | Total | 100.00 | 100.00 | 100.00 | 100.00 | 100.00 | 100.00 |
|  |  | $Ag_2O/V_2O_5$ | 2.18 | 2.18 | 2.18 | 2.18 | 2.18 | 2.19 |
|  |  | Melt Temp | 700 | 700 | 700 | 600 | 600 | 600 |
|  |  | Dwell at melting temp. | 15 | 15 | 15 | 15 | 15 | 15 |
|  |  | Preheat Temp | 550 | 550 | 550 | 550 | 550 | 550 |
|  |  | Precrystallize | — | — | — | — | — | — |
|  |  | Tg | 148.19 | 151.21 | 151.27 | 141.62 | 144.04 | 150.8 |
|  |  | TC1 − Tg | 32.48 | 38.23 | 63 | 27.7 | 29.94 | 29.2 |
|  |  | TC1 | 180.67 | 189.44 | 214.27 | 169.32 | 173.98 | 180 |
|  |  | TC1 (J/g) | 35.61 | 36.09 | 34.74 | 31.15 | 28.74 | 30.64 |
|  |  | TC2 | 277.9 | 262.55 | 264.18 | | | |
|  |  | TC2 (J/g) | 7.55 | 6.44 | 3 | | | |
|  |  | TC3 | | | 300.46 | | | |
|  |  | TC3 (J/g) | | | 2.13 | | | |
|  |  | TR1 | 353.02 | 355.87 | 361.35 | 362.14 | 357.04 | 354.39 |
|  |  | TR1 (J/g) | −48.88 | −43.24 | −51.52 | −52.87 | −59.78 | −19.24 |
|  |  | TR2 | 387.18 | | | | | |
|  |  | TR2 (J/g) | −5.37 | | | | | |
|  |  | TR3 | | | | | | |
|  |  | TR3 (J/g) | | | | | | |
|  |  | Comments | | | | | | |
|  |  | bach size | 10 g | 10 g | 10 g | 10 g | 10 g | 10 g |
|  |  | Melt pour | Excellent | Excellent | Excellent | Fair | Good | Good |

TABLE 3

|  |  | glass flit No. | | | | | |
|---|---|---|---|---|---|---|---|
|  |  | 17 | 18 | 19 | Reference 5 | 29 | 30 |
|  | No | SC144-4 | SC145-4 | SC146-4 | SC147-4 | SC185-4 | SC186-4 |
|  | Lot | 061611 | 061611 | 061611 | 061611 | 071411 | 080511 |
|  | mesh | 100/200 | 100/200 | 100/200 | 100/200 | 100/200 | 100/200 |
| (B-1) | $Ag_2O$ | 62.73 | 62.04 | 60.67 | 57.93 | 63.07 | 60.33 |
| (B-2) | $V_2O_5$ | 28.77 | 28.46 | 27.83 | 26.57 | 28.93 | 27.67 |
| (B-3) | $MoO_3$ | 7.50 | 7.50 | 7.50 | 7.50 | 4.00 | 4.00 |
| (B-4) | ZnO | | | | | | |
|  | CuO | 1.00 | 2.00 | 4.00 | 8.00 | 4.00 | 8.00 |
|  | $TiO_2$ | | | | | | |
|  | $SiO_2$ | | | | | | |
|  | $Bi_2O_3$ | | | | | | |
|  | $Al_2O_3$ | | | | | | |
|  | SnO | | | | | | |
|  | $MnO_2$ | | | | | | |
|  | MgO | | | | | | |
|  | $Nb_2O_5$ | | | | | | |
|  | $Fe_2O_3$ | | | | | | |
|  | BaO | | | | | | |
| Others | $TeO_2$ | | | | | | |
|  | $Sb_2O_3$ | | | | | | |
|  | Total | 100.00 | 100.00 | 100.00 | 100.00 | 100.00 | 100.00 |
|  | $Ag_2O/V_2O_5$ | 2.18 | 2.18 | 2.18 | 2.18 | 2.18 | 2.18 |
|  | Melt Temp | 700 | 700 | 700 | 700 | 700 | 700 |
|  | Dwell at melting temp. | 15 | 15 | 15 | 15 | 15 | 15 |
|  | Preheat Temp | 550 | 550 | 550 | 550 | 550 | 550 |
|  | Precrystallize | — | — | — | — | — | — |
|  | Tg | 149.29 | 152.33 | 158 | 172.43 | 151.38 | 164.95 |
|  | TC1 − Tg | 33.29 | 44.46 | 70.15 | 57.27 | 70.54 | 57.67 |
|  | TC1 | 182.58 | 196.79 | 228.15 | 229.7 | 221.92 | 222.62 |

TABLE 3-continued

| | | | | | | | |
|---|---|---|---|---|---|---|---|
| TC1 (J/g) | | 36.42 | 42.29 | 47.53 | 43.32 | 40.22 | 35.13 |
| TC2 | | | 290.65 | 295.55 | | | 303.81 |
| TC2 (J/g) | | | 2.33 | 0.49 | | | 2.13 |
| TC3 | | | | | | | |
| TC3 (J/g) | | | | | | | |
| TR1 | | 351.22 | 358.64 | 348.37 | 352.24 | 350.22 | 348.8 |
| TR1 (J/g) | | −43.45 | −37.33 | −21.99 | −13.67 | −52.54 | −52.55 |
| TR2 | | | | 406.63 | 406.49 | | |
| TR2 (J/g) | | | | −32.14 | −36.61 | | |
| TR3 | | | | | | | |
| TR3 (J/g) | | | | | | | |
| Comments | | | | | | | |
| bach size | | 10 g | 10 g | 10 g | 10 g | 10 g | 10 g |
| Melt pour | | Excellent | Excellent | Excellent | Excellent | Excellent | Excellent |

| | | glass flit No. | | | | |
|---|---|---|---|---|---|---|
| | | 32 | 33 | 34 | 35 | 36 |
| | No | SC148-4 | SC149-4 | SC150-4 | SC151-4 | SC152-4 |
| | Lot | 061711 | 061711 | 061711 | 061711 | 061711 |
| | mesh | 100/200 | 100/200 | 100/200 | 100/200 | 100/200 |
| (B-1) | $Ag_2O$ | 60.67 | 59.30 | 59.30 | 57.93 | 55.19 |
| (B-2) | $V_2O_5$ | 27.83 | 27.20 | 27.20 | 26.57 | 25.31 |
| (B-3) | $MoO_3$ | 7.50 | 7.50 | 7.50 | 7.50 | 7.50 |
| (B-4) | ZnO | 2.00 | 2.00 | 4.00 | 4.00 | 8.00 |
| | CuO | 2.00 | 4.00 | 2.00 | 4.00 | 4.00 |
| | $TiO_2$ | | | | | |
| | $SiO_2$ | | | | | |
| | $Bi_2O_3$ | | | | | |
| | $Al_2O_3$ | | | | | |
| | SnO | | | | | |
| | $MnO_2$ | | | | | |
| | MgO | | | | | |
| | $Nb_2O_5$ | | | | | |
| | $Fe_2O_3$ | | | | | |
| | BaO | | | | | 0.00 |
| Others | $TeO_2$ | | | | | |
| | $Sb_2O_3$ | | | | | |
| | Total | 100.00 | 100.00 | 100.00 | 100.00 | 100.00 |
| | $Ag_2O/V_2O_5$ | 2.18 | 2.18 | 2.18 | 2.18 | 2.18 |
| | Melt Temp | 700 | 700 | 700 | 700 | 700 |
| | Dwell at melting temp. | 15 | 15 | 15 | 15 | 15 |
| | Preheat Temp | 550 | 550 | 550 | 550 | 550 |
| | Precrystallize | — | — | — | — | — |
| | Tg | 157.81 | 162.96 | 164.41 | 167.4 | 181.31 |
| | TC1 − Tg | 67.95 | 55.02 | 60.96 | 52.58 | 43.58 |
| | TC1 | 225.76 | 218 | 225.37 | 219.98 | 224.89 |
| | TC1 (J/g) | 42.76 | 43.37 | 41.68 | 40.71 | 33.97 |
| | TC2 | 298.82 | | 301.36 | 321.83 | 254.53 |
| | TC2 (J/g) | 1.23 | | 0.7 | 3.96 | 1.38 |
| | TC3 | | | | | 325.99 |
| | TC3 (J/g) | | | | | 3.87 |
| | TR1 | 346.83 | 345 | 345.18 | 342.85 | 341.92 |
| | TR1 (J/g) | −32.33 | −28.51 | −36.83 | −27.53 | −23.07 |
| | TR2 | | 401.14 | 395.22 | 400.09 | 388.34 |
| | TR2 (J/g) | | | −20.98 | −21.75 | −2.2 |
| | TR3 | | | | | 418.71 |
| | TR3 (J/g) | | | | | −3.01 |
| | Comments | | | | | |
| | bach size | 10 g | 10 g | 10 g | 10 g | 10 g |
| | Melt pour | Excellent | Excellent | Excellent | Excellent | Excellent |

As seen from Table 1, with respect to the glass frit (Reference 13: SC215-4) comprising antimony oxide ($Sb_2O_3$) as a raw material, a remelting temperature was not able to be measured.

Figure 2:
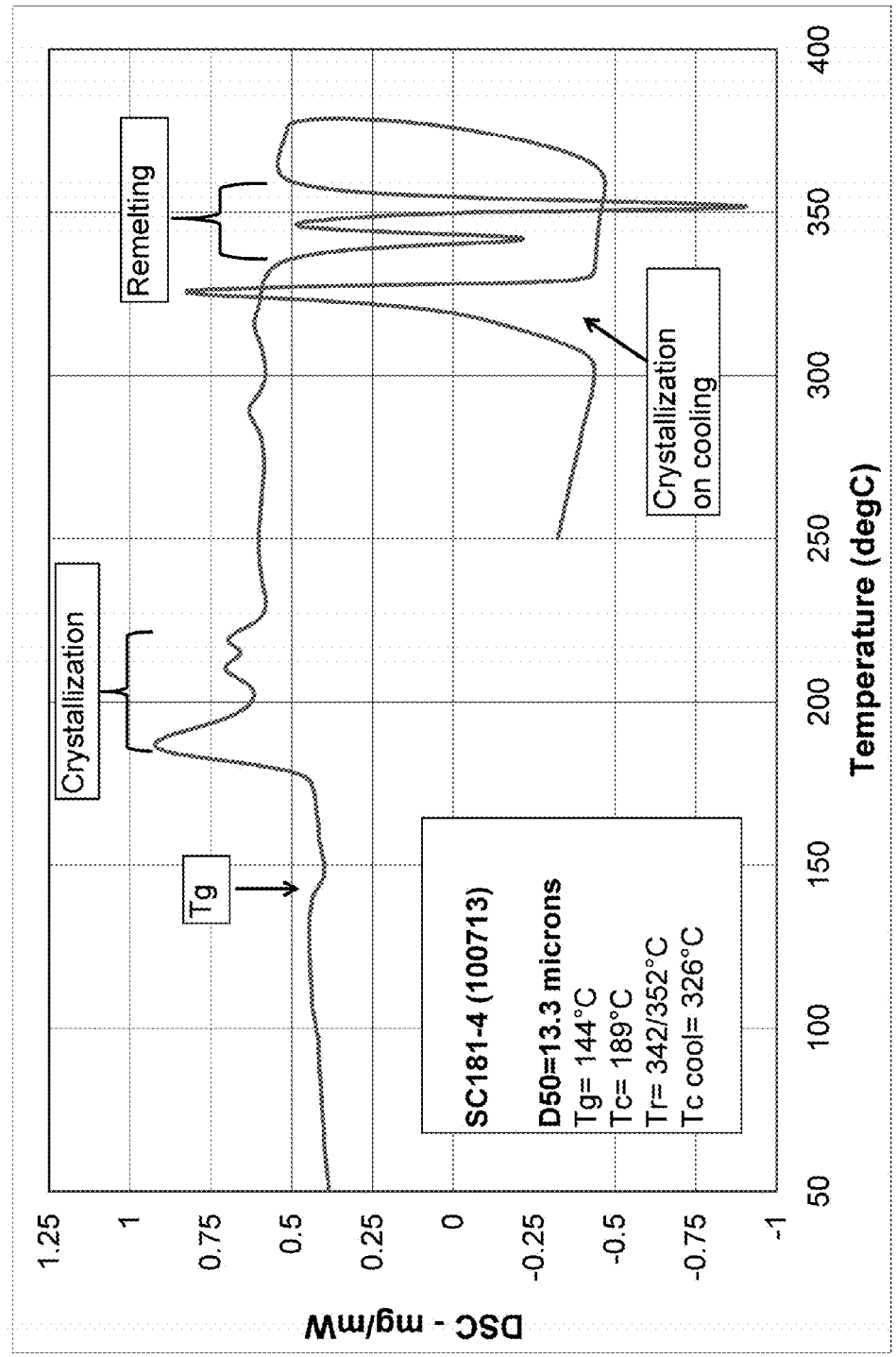
FIG. 2 shows a DSC curve of glass frit No. 25 (SC181-4) as measured by a differential scanning calorimeter.

FIG. 2 shows a DSC curve of glass frit No. 25 {SC181-4 (100713)} as measured by a differential scanning calorimeter. The glass frit had an average particle diameter (D50) of 13.3 μm. In FIG. 2, the glass transition temperature (Tg) was 144° C., the crystallization temperature (Tc) was 189° C., the remelting temperature (Tr) was 342° C. or 352° C., and the crystallization temperature (Tc cool) upon gradually cooling after removal from the oven was 326° C. The reason that there is a very small difference between glass frit No. 25 (No. SC181-4, Lot. 071411) shown in Table 1 and glass frit No. 25 (No. SC181-4, Lot. 100713) shown in FIG. 2 with respect to each of the glass transition temperature (Tg), crystallization temperature (Tc), and remelting temperature (Tr) resides in the difference of the lot number (Lot) for glass frit No. 25.

Examples 1 to 8 and Comparative Examples 1 and 2

Next, using the glass frits of Nos. 1, 4, 8, 13, 25, 28, 29, 37, and 38 and Nos. Reference 10, Reference 11, and Reference 12, and using the raw materials shown below, the conductive pastes in Examples and Comparative Examples were prepared.

<Materials for the Conductive Paste>

Materials for the conductive paste are shown below. The formulations of the conductive pastes in Examples 1 to 8 and Comparative Examples 1 and 2 are shown in Table 4.

Conductive particles: Ag; spherical; BET value: 0.6 m$^2$/g; average particle diameter D50: 6.4 μm; 6 g {71.6% by mass, based on the mass of the conductive paste (100% by mass)}; trade name: EA-0001 (manufactured by Metalor Technologies Corporation). The average particle diameter of the conductive particles is a D50 (median diameter) in the volume cumulative distribution as measured using a laser diffraction-scattering type measurement apparatus for particle diameter and particle size distribution (for example, MICROTRAC HRA9320-X100, manufactured by Nikkiso Co., Ltd.).

Solvent: Terpineol; 0.88 g {10.5% by mass, based on the mass of the conductive paste (100% by mass)}

Glass frit: Glass frits of Nos. 1, 4, 8, 13, 25, 28, 29, 37, and 38 and Reference 10, 11, and 12; 1.5 g {17.9% by mass, based on the mass of the conductive paste (100% by mass)}. With respect to each glass frit, one obtained by grinding one type of glass frit using a mortar and subjecting the ground glass frit to sieve classification using a 325-mesh sieve was used. The glass frit obtained after the sieve classification has an average particle diameter (D50) of about 13 to about 20 μm.

TABLE 4

|  | (g) | Mass % |
| --- | --- | --- |
| Silver particles | 6.00 | 71.6 |
| Glass frit | 1.50 | 17.9 |
| Solvent (Terpineol) | 0.88 | 10.5 |
| Total | 8.38 | 100 |

<Method for Producing the Conductive Paste>

The materials for conductive paste having the formulation shown in Table 4 were kneaded by means of a three-roll mill to prepare a conductive paste.

With respect to each of the conductive pastes in Examples and Comparative Examples, a thermal resistance (Rth) test was performed to measure an electric resistivity, evaluating the electrical conductive properties. Further, with respect to each of the conductive pastes in Examples and Comparative Examples, a die shear stress (DSS) test was performed to measure a bond strength, evaluating the heat resistance.

[Thermal Resistance (Rth) Test (Electric Resistivity)]

A heat resistant tape was put on slide glass, and a groove having a width of 3 mm, a length of 60 mm, and a thickness of about 200 μm was formed in the tape, and the conductive paste was applied into the groove by squeezing, and calcined at 370° C. for 10 minutes. Then, an electric resistance between both ends of the resultant coating film was measured by means of a digital multimeter, and a dimension of the coating film was measured, and an electric resistivity was calculated from the measured values.

[Die Shear Stress (DSS) Test (Bond Strength)]

The conductive paste was dispensed in an appropriate amount on an alumina sheet, and a 2 mm×2 mm silicon chip was mounted on the dispensed paste, and a downward load was applied to the chip so that the thickness of the bonding portion (conductive paste) became about 30 μm using a spacer, followed by calcination at 370° C. for 10 minutes, to prepare a specimen. The prepared specimen was placed in an environment at 300° C. and subjected to die shear stress (DSS) test (300° C.) at a rate of 200 μsec using Multipurpose Bondtester, manufactured by Dage Japan Co., Ltd., to measure a bond strength.

TABLE 5

| Paste No. | Glass flit No. | No. | Electric resistivity (RT) (×10$^{-4}$ Ω · cm) | Bond strength at 300° C. (kgf) |
| --- | --- | --- | --- | --- |
| Example 1 | 1 | SC112-4 | 16.3 | 15.8 |
| Example 2 | 25 | SC181-4 | 12.5 | 12.7 |
| Example 3 | 38 | SC322-4 | 14.2 | 13.3 |
| Example 4 | 37 | SC317-4 | 9.5 | 10.3 |
| Example 5 | 29 | SC185-4 | 12.1 | 12.2 |
| Example 6 | 28 | SC184-4 | 10.6 | 8.2 |
| Example 7 | 13 | SC140-4 | 14.9 | 13.2 |
| Example 8 | 8 | SC129-4 | 8.2 | 8.3 |
| Comparative example 1 | Reference 11 | SC318-4 | 12.2 | 7.0 |
| Comparative example 2 | Reference 12 | SC165-4 | 12.9 | 7.7 |

[kgf]

The conductive pastes in Examples maintained the bond strength at 8 kgf or more even in an environment at a temperature as relatively high as 300° C. In contrast, the conductive paste in Comparative Example 1 using the glass frit in Reference 11 and the conductive paste in Comparative Example 2 using the glass frit in Reference Example 12 exhibited a bond strength of less than 8 kgf in an environment at a temperature as relatively high as 300° C. In the glass frit in Reference 11, the remelting temperature indicated by the peak top of at least one endothermic peak having an endotherm of 20 J/g or more as measured by a differential scanning calorimeter is not present in the temperature region of from 320 to 360° C. The glass frit in Reference 12 comprises tellurium oxide (TeO$_2$) as a raw material.

Examples 9 to 14

Conductive pastes having the respective formulations shown in Table 7 were produced, and a thermal resistance (Rth) test was performed with respect to each of the produced conductive pastes to measure an electric resistivity, evaluating the electrical conductive properties. Further, with respect to each of the conductive pastes in Examples and Comparative Examples, a die shear stress (DSS) test was performed to measure a bond strength, evaluating the heat resistance.

FIG. 3 shows scanning electron microscope (SEM) photomicrographs of the silver particles used in Examples 9 to 14, taken at magnifications of 1,000 times, 2,000 times, and 5,000 times.

Example 9

Production of a Conductive Paste (MP12-102-1)

Silver particles: P318-8, K-0082P (manufactured by Metalor Technologies Corporation); The mass ratio of P318-8 silver particles and K-0082P silver particles (P318-8:K-0082) is 50:50.

Figure 4:
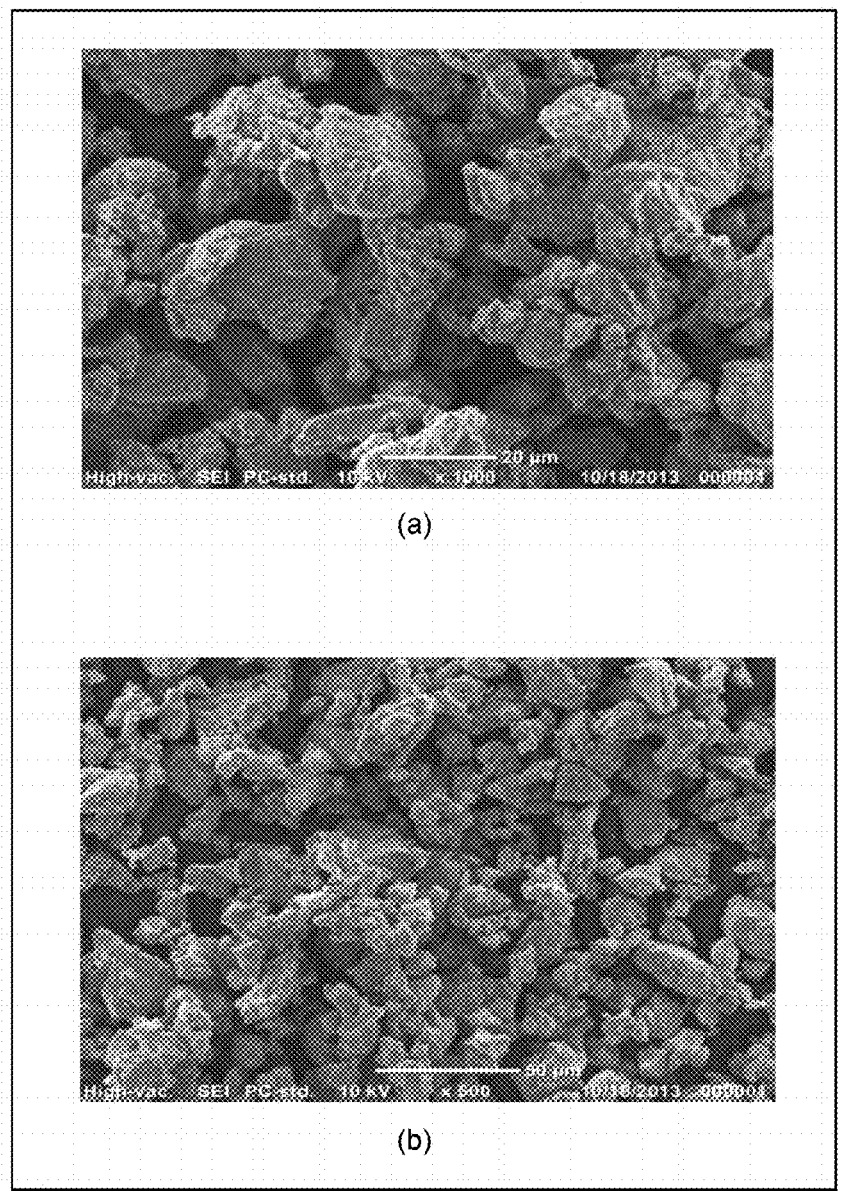
FIG. 4 shows scanning electron microscope (SEM) photomicrographs of glass frit No. 25 (SC181-4), taken at magnifications of (a) 1,000 times and (b) 500 times, wherein glass frit No. 25 is obtained after sieve classification using a 400-mesh sieve.

Glass frit: No. 25 (SC181-4); The specific surface area (Specific surface) of the glass frit measured by a BET method and the particle diameter of the glass frit measured by a laser diffraction-scattering method using MICROTRAC HRA9320-X100, manufactured by Nikkiso Co., Ltd., are shown in Table 6. With respect to glass frit No. 25, one obtained by grinding 100 g of the glass frit by means of a ball mill for 48 hours and subjecting the ground glass frit to sieve classification using a 400-mesh sieve was used. FIG. 4 shows scanning electron microscope (SEM) photomicrographs of glass frit No. 25 (SC181-4), taken at magnifications of (a) 1,000 times and (b) 500 times, wherein glass frit No. 25 was obtained after grinding by means of a ball mill for 48 hours and subsequent sieve classification using a 400-mesh sieve.

Zinc oxide: Zinc oxide (ZnO) powder (manufactured by Stream Chemicals, Inc.), which was added in an amount of 0.55% by weight in order to improve the die attach properties.

Organic solvent: Terpineol

The silver particles, glass frit, zinc oxide powder, and organic solvent were mixed in the formulation shown in Table 7 and kneaded by means of a three-roll mill to prepare a conductive paste. Table 7 shows the formulations of the conductive pastes used in Examples 9 to 14, the sizes of glass frits, and the results of the DSS test and Rth test.

TABLE 6

| Glass flit No. | 25 |
|---|---|
| Glass powder | SC 181-4 |
| Lot No. | 100713 |
| Milling time | 48 hours |
| SSA (m2/g) | 0.274 |
| D10 | 6.31 mm |
| D25 | 8.89 mm |
| D50 | 13.32 mm |
| D75 | 19.44 mm |
| D90 | 26.52 mm |

Using the conductive paste in Example 9 (MP12-102-1), the semiconductor chip (die) and substrate shown below were bonded together, and a die shear stress (DSS) test at room temperature or a thermal resistance (Rth) test was performed in the same manner as in Examples 1 to 8. The results are shown in Table 7. In Table 7, the die shear stress (DSS) test at room temperature is indicated by "RT", and the die shear stress (DSS) test at 300° C. is indicated by "300 C".

[Combination of a Chip (Die) Having a Non-Plated Surface and a Substrate Having a Non-Plated Surface]
  Si die on Al$_2$O$_3$ substrate: 0.25" Si/Al$_2$O$_3$ (bare); DSS test (RT)
  Si die on Si substrate: 0.3" Si/0.4" Si (bare); Rth test

[Combination of a Chip (Die) Having a Plated Surface and a Substrate Having a Non-Plated Surface]
  Au-plated Si die on Al$_2$O$_3$ substrate: 0.1" AuSi/Al$_2$O$_3$ (metallized); DSS test (RT)

[Combination of a Chip (Die) Having a Plated Surface and a Substrate Having a Plated Surface]
  Au-plated Si die on Ag-plated Cu substrate: 0.1" AuSi/AgCu (metallized); DSS test (RT)
  Au-plated SiC die on Ag-plated Cu substrate: 0.1" AuSiC/AgCu (metallized); DSS test (RT)
  Au-plated Si die on Au-plated Si substrate: 0.3" AuSi/0.4" AuSi (metallized); DSS test (RT), Rth test In Table 7, indications '0.25"', '0.1"', '0.2"', '0.3"', and '0.4"' mean a size of the die (chip) or substrate.

For example, '0.25"' indicates a 0.25 inch×0.25 inch die (chip), '0.1"' indicates a 0.1 inch×0.1 inch die (chip), '0.2"' indicates a 0.2 inch×0.2 inch die (chip), and '0.3"' indicates a 0.3 inch×0.3 inch die (chip). '0.4"' indicates a 0.4 inch×0.4 inch substrate.

Example 10

Using the conductive paste (MP12-102-1), a thermal die shear stress test at 300° C. was performed for the chip (die) and substrate shown below. The results are shown in Table 7.
  Au-plated Si die on Al$_2$O$_3$ substrate: 0.1" AuSi/Al$_2$O$_3$ (metallized); DSS test (300° C.)

Example 11

Conductive pastes (MP12-65-2, MP12-101-1, MP12-102-1, MP12-103-1, MP12-105-1) having different zinc oxide (ZnO) contents in the range of 0.14 to 2.2% by weight were individually produced.

Silver particles: P318-8, K-0082P (manufactured by Metalor Technologies Corporation); The mass ratio of P318-8 silver particles and K-0082P silver particles (P318-8:K-0082P) is 50:50.

Glass frit: Glass frit No. 25 (SC181-4); 18.4% by weight
Organic solvent: Terpineol; 8.1% by weight The silver particles, glass frit, zinc oxide powder, and organic solvent were mixed in the formulations shown in Table 6 and kneaded by means of a three-roll mill to prepare conductive pastes. The electric resistivities of the conductive pastes are shown in Table 7.

Using each of the conductive pastes, the chip (die) and substrate shown below were bonded together by elevating the temperature to 370° C. at a temperature elevation rate of 20° C./min and maintaining that temperature for 10 minutes to prepare a specimen, and a DSS test and an Rth test were conducted with respect to the specimen. The results are shown in Table 7.
  Au-plated Si die on Al$_2$O$_3$ substrate: 0.1" AuSi/Al$_2$O$_3$ (metallized); DSS test (RT)
  Au-plated Si die on Au-plated Si substrate: 0.3" AuSi/0.4" AuSi (metallized); Rth test Example 12

Conductive pastes having different combinations of silver particles were individually produced.

Silver Particles

Conductive paste (MP12-67-1) using the silver particles in which the mass ratio of SA-1507 and K-0082P (SA-1507:K-0082P) is 50:50.

Conductive paste (MP12-67-2) using the silver particles in which the mass ratio of P318-8 and K-0082P (P318-8:K-0082P) is 50:50.

Zinc oxide (ZnO): 0.14% by weight
Glass frit: Glass frit No. 25 (SC181-4); 9.23% by weight
Organic solvent: Terpineol; 7.7% by weight The silver particles, glass frit, zinc oxide powder, and organic solvent were mixed in the formulations shown in Table 6 and kneaded by means of a three-roll mill to prepare conductive pastes. The electric resistivities of the conductive pastes are shown in Table 7.

Using each of the conductive pastes, the Si chip (die) and Si substrate shown in Table 7 were bonded together by elevating the temperature to 370° C. at a temperature elevation rate of 20° C./min and maintaining that temperature for 10 minutes to prepare a specimen (0.3" Si/0.4" Si), and a DSS test (RT) and an Rth test were conducted with respect to the specimen. The results are shown in Table 7.

Example 13

Conductive pastes were individually produced using the materials shown below.
Silver Particles
The mass ratio of P318-8 and K-0082P (P318-8:K-0082P) was changed in the range of from 1:1 to 3:1.
The conductive paste (MP12-99-1) and conductive paste (MP12-99-2) contain glass frit No. 25 (SC181-4) in an amount of 18.4% by weight and contain no zinc oxide (ZnO).
The conductive paste (MP12-101-1) and conductive paste (MP12-101-2) contain glass frit No. 25 (SC181-4) in an amount of 18.4% by weight and zinc oxide (ZnO) in an amount of 0.27% by weight.
Using each of the conductive pastes, the chip (die) and substrate shown in Table 7 were bonded together by elevating the temperature to 370° C. at a temperature elevation rate of 20° C./min and maintaining that temperature for 10 minutes to prepare a specimen, and a DSS test and an Rth test were conducted with respect to the specimen.
The results are shown in Table 7.

Example 14

Conductive pastes having different glass frit contents were individually produced.
Conductive paste (MP12-88-1) containing the glass frit in an amount of 9.23% by weight
Conductive paste (MP12-65-2) containing the glass frit in an amount of 18.46% by weight
Conductive paste (MP12-88-2) containing the glass frit in an amount of 27.69% by weight
Silver particles: The mass ratio of P318-8 and K-0082P contained (P318-8:K-0082P) is 1:1.
Zinc oxide: Zinc oxide (ZnO); 0.14% by weight
Using each of the conductive pastes, the chip (die) and substrate shown in Table 7 were bonded together by elevating the temperature to 370° C. at a temperature elevation rate of 20° C./min and maintaining that temperature for 10 minutes to prepare a specimen, and a DSS test and an Rth test were conducted with respect to the specimen. The results are shown in Table 7.

TABLE 7

| Ag/Glass Paste | | MP12-65-2 | MP12-67-1 | MP12-67-2 | MP12-88-1 | MP12-88-2 | MP12-99-1 |
|---|---|---|---|---|---|---|---|
| Example(s) | | 11, 14 | 12 | 12 | 14 | 14 | 13 |
| Paste Formulation | | | | | | | |
| K-0082P (Ag) | (weight %) | 36.68 | 41.47 | | 41.46 | 32.24 | 36.74 |
| P318-3 (Ag) | (weight %) | 36.68 | | 41.47 | 41.46 | 32.24 | 36.74 |
| SA-1507 (Ag) | (weight %) | | 41.47 | 41.47 | | | |
| Znc Oxide (99.7%) | (weight %) | 0.14 | 0.14 | 0.14 | 0.14 | 0.14 | 0 |
| Terpineol (Slovent) | (weight %) | 8.14 | 7.70 | 7.70 | 7.70 | 7.70 | 8.14 |
| SC181-4 Glass | (weight %) | 18.46 | 9.23 | 9.23 | 9.23 | 27.69 | 18.37 |
| Total | (weight %) | 100.09 | 100.01 | 100.01 | 99.99 | 100.00 | 100.00 |
| Glass mesh cut | | −400 | −400 | −400 | −400 | −400 | −400 |
| Glass particel size (D50) | (μm) | 20 μm | 13 μm | 13 μm | 20 μm | 20 μm | 13 μm |
| Heat Treatment Temperature | (° C.) | 370° C. | 370° C. | 370° C. | 370° C. | 370° C. | 370° C. |
| Resistivity | (μΩ-cm) | 8.9 | 6 | 3.8 | | | 8.3 |
| Die Shear Stress (DSS) | (Mpa) | | | | | | |
| 0.25"Si/Al2O3 (bare) | RT | 27.5 | | | | | |
| 0.1"Si/Al2O3 (bare) | RT | | 33.1 | 43.4 | 38.6 | 37.9 | |
| 0.1"AuSi/Al2O3 (metalized) | RT | 35.2 | | | 26.2 | 37.9 | 39.3 |
| 0.1"AuSi/Al2O3 (metalized) | 300 C. | | | | | | |
| 0.1"AuSi/AgCu (metallized) | RT | 46.2 | | | | | |
| 0.1"AuSiC/AgCu (metallized) | RT | 42.1 | | | | | |
| Thermal Resistance (Rth) | (Kcm2/W) | | | | | | |
| 0.3"Si/0.4"Si (bare) | RT | 0.0283 | 0.023 | 0.0221 | 0.0398 | 0.0497 | |
| 0.3"AuSi/0.4"AuSi (metallized) | RT | 0.0103 | | | | | 0.0223 |

| Ag/Glass Paste | | MP12-99-2 | MP12-101-1 | MP12-101-2 | MP12-102-1 | MP12-103-1 | MP12-105-1 |
|---|---|---|---|---|---|---|---|
| Example(s) | | 13 | 11, 13 | 13 | 9, 10, 11 | 11 | 11 |
| Paste Formulation | | | | | | | |
| K-0082P (Ag) | (weight %) | 18.37 | 36.61 | 18.23 | 36.47 | 36.19 | 35.64 |
| P318-3 (Ag) | (weight %) | 55.12 | 36.61 | 54.98 | 36.47 | 36.19 | 35.64 |
| SA-1507 (Ag) | (weight %) | | | | | | |
| Znc Oxide (99.7%) | (weight %) | 0 | 0.27 | 0.27 | 0.55 | 1.20 | 2.20 |
| Terpineol (Slovent) | (weight %) | 8.14 | 8.14 | 8.14 | 8.14 | 8.14 | 8.14 |
| SC181-4 Glass | (weight %) | 18.37 | 18.46 | 18.37 | 18.37 | 18.37 | 18.37 |
| Total | (weight %) | 100.00 | 100.08 | 99.99 | 100.00 | 100.10 | 100.00 |
| Glass mesh cut | | −400 | −400 | −400 | −400 | −400 | −400 |
| Glass particel size (D50) | (μm) | 13 μm | 13 μm | 13 μm | 13 μm | 13 μm | 13 μm |
| Heat Treatment Temperature | (° C.) | 370° C. | 370° C. | 370° C. | 370° C. | 370° C. | 370° C. |
| Resistivity | (μΩ-cm) | | 8.5 | | 7.5 | 6.9 | 8.1 |
| Die Shear Stress (DSS) | (Mpa) | | | | | | |
| 0.25"Si/Al2O3 (bare) | RT | | | | | | |
| 0.1"Si/Al2O3 (bare) | RT | | | | 48.9 | | |
| 0.1"AuSi/Al2O3 (metalized) | RT | 35.2 | 37.9 | 38.6 | 44.1 | 37.2 | 39.3 |
| 0.1"AuSi/Al2O3 (metalized) | 300 C. | | | | 26.2 | | |
| 0.1"AuSi/AgCu (metallized) | RT | | | | 51.7 | | |

TABLE 7-continued

| | | | | | | | |
|---|---|---|---|---|---|---|---|
| 0.1"AuSiC/AgCu (metallized) Thermal Resistance (Rth) | RT (Kcm2/W) | | 22.8 | | 40.0 | 32.4 | |
| 0.3"Si/0.4"Si (bare) | RT | | | | 0.0391 | | |
| 0.3"AuSi/0.4"AuSi (metallized) | RT | 0.0207 | 0.0100 | 0.0118 | 0.0097 | 0.0079 | 0.0136 |

[Observations on the Results]

The conductive paste (MP12-102-1) exhibited excellent bond strength between the metallized chip (die) or non-metallized chip (die) and the substrate and excellent electric resistivity.

The conductive pastes (MP12-65-2, MP12-101-1, MP12-102-1, MP12-103-1, MP12-105-1) having zinc oxide (ZnO) added thereto exhibited excellent electric resistivity and excellent bond strength.

The conductive pastes (MP12-67-1, MP12-67-2) using silver particles in which the mass ratio of P318-8 and K-0082P (P318-8:K-0082P) is 50:50 exhibited excellent properties.

The conductive pastes (MP12-88-1, MP12-65-2, MP12-88-2) having different glass frit contents exhibited excellent bond strength.

The conductive pastes (MP12-99-1, MP12-99-2) containing no zinc oxide (ZnO) were slightly increased in electric resistivity, and thus exhibited poor electric resistivity, as compared to the conductive paste having added thereto zinc oxide (ZnO).

INDUSTRIAL APPLICABILITY

The conductive paste of the present invention is advantageous not only in that an injurious material, such as lead (Pb), arsenic (As), tellurium (Te), or antimony (Sb), is substantially not contained in the paste, but also in that, for example, a semiconductor chip and a substrate can be bonded by the paste at a relatively low temperature (for example, at 370° C. or lower; for example, when the remelting temperature of the glass frit is 360° C., at a temperature of higher than 360 to 370° C.) to obtain a semiconductor device. Further, the semiconductor device obtained by bonding a semiconductor chip to a substrate using the conductive paste of the present invention can maintain the bond strength between the semiconductor chip and the substrate even when the device is present in an environment at a relatively high temperature (for example, at 300 to 350° C.). The conductive paste of the present invention can be advantageously used in forming a die attach material, a sealing material, or an electrode which can be applied to electronic parts, such as a ceramic package containing therein an integrated circuit device and a display device, i.e., objects to be bonded or adherends which are extremely sensitive to heat. Particularly, the conductive paste of the present invention and the method for producing a semiconductor device using the same can be advantageously used in a die attach material for bonding a SiC semiconductor chip which causes only a small loss in the electric power conversion and which can be stably operated even at high temperatures, and thus are of great industrial significance.

DESCRIPTION OF REFERENCE NUMERALS

1: Conductive paste
1': Calcined film formed from the conductive paste
2: Gap
3: Semiconductor chip
4: Substrate
5: Semiconductor device

The invention claimed is:

1. A conductive paste comprising:
(A) conductive particles,
(B) a glass frit containing substantially no lead, arsenic, tellurium, and antimony, and
(C) a solvent,
the glass frit (B) having a remelting temperature of 320 to 360° C., wherein the remelting temperature is indicated by a peak top of at least one endothermic peak having an endotherm of 20 J/g or more in a DSC curve as measured by a differential scanning calorimeter.

2. The conductive paste according to claim 1, further comprising (D) at least one metal oxide selected from the group consisting of tin oxide, zinc oxide, indium oxide, and copper oxide.

3. The conductive paste according to claim 1, wherein the conductive particles (A) are contained in an amount of 60 to 90% by mass, the glass frit (B) is contained in an amount of 5 to 35% by mass, and the solvent (C) is contained in an amount of 5 to 12% by mass, based on the mass of the conductive paste.

4. The conductive paste according to claim 2, wherein the conductive particles (A) are contained in an amount of 60 to 85% by mass, the glass frit (B) is contained in an amount of 5 to 35% by mass, the solvent (C) is contained in an amount of 5 to 10% by mass, and the at least one metal oxide (D) is contained in an amount of 0 to 5% by mass, based on the mass of the conductive paste.

5. The conductive paste according to claim 1, wherein the glass frit (B) comprises (B-1) $Ag_2O$, (B-2) $V_2O_5$, and (B-3) $MoO_3$.

6. The conductive paste according to claim 5, wherein the glass frit (B) further comprises (B-4) at least one oxide selected from the group consisting of ZnO, CuO, $TiO_2$, MgO, $Nb_2O_5$, BaO, $Al_2O_3$, SnO, and $Fe_2O_3$.

7. The conductive paste according to claim 5, wherein the glass frit (B) contains $Ag_2O$ (B-1) and $V_2O_5$ (B-2) in a total amount of 80 to 96% by mass in terms of the oxide, based on the mass of the glass frit (B), wherein a mass ratio of $Ag_2O$ (B-1) to $V_2O_5$ (B-2) ($Ag_2O/V_2O_5$) is 1.8 to 3.2.

8. The conductive paste according to claim 5, wherein the glass frit (B) contains $MoO_3$ (B-3) in an amount of 4 to 10% by mass in terms of the oxide, based on the mass of the glass frit (B).

9. The conductive paste according to claim 6, wherein the glass frit (B) contains $MoO_3$ (B-3) and the at least one oxide (B-4) in a total amount of 4 to 20% by mass in terms of the oxide, based on the mass of the glass frit (B).

10. The conductive paste according to claim 5, wherein the glass frit (B) contains $Ag_2O$ (B-1) in an amount of 40 to 80% by mass, $V_2O_5$ (B-2) in an amount of 16 to 40% by mass, and $MoO_3$ (B-3) in an amount of 4 to 10% by mass, each in terms of the oxide, based on the mass of the glass frit (B).

11. The conductive paste according to claim 6, wherein the glass frit (B) contains the at least one oxide (B-4) in an amount of 0 to 12% by mass in terms of the oxide, based on the mass of the glass frit (B).

12. The conductive paste according to claim 1, wherein the conductive particles (A) are silver.

13. The conductive paste according to claim 1, wherein a mass ratio of the conductive particles (A) and the glass frit (B) (conductive particles:glass frit) is 50:50 to 98:2.

14. A method for producing a semiconductor device comprising the steps of:
applying the conductive paste according to claim 1 to at least one of a substrate and a semiconductor chip;
placing the semiconductor chip on the substrate through the conductive paste;
heating the conductive paste to the remelting temperature or higher of the glass frit (B) contained in the conductive paste to sinter the conductive particles (A) contained in the conductive paste so that the semiconductor chip and the substrate are electrically connected to each other; and
gradually cooling the conductive paste.

15. A method for producing a semiconductor device comprising the steps of:
applying the conductive paste according to claim 1 to at least one of a substrate and a semiconductor chip;
placing the semiconductor chip on the substrate through the conductive paste;
heating the conductive paste to reduce $Ag_2O$ (B-1) in the glass frit (B) contained in the conductive paste;
further heating the conductive paste to the remelting temperature or higher of the glass frit (B) contained in the conductive paste; and
gradually cooling the conductive paste to cause crystals to be deposited.

* * * * *